(12) United States Patent
Yano et al.

(10) Patent No.: US 12,395,684 B2
(45) Date of Patent: Aug. 19, 2025

(54) IMAGE PROCESSING APPARATUS AND METHOD

(71) Applicant: SONY GROUP CORPORATION, Tokyo (JP)

(72) Inventors: Koji Yano, Tokyo (JP); Tsuyoshi Kato, Tokyo (JP); Satoru Kuma, Tokyo (JP); Ohji Nakagami, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/397,989

(22) Filed: Dec. 27, 2023

(65) Prior Publication Data
US 2024/0129555 A1    Apr. 18, 2024

Related U.S. Application Data

(62) Division of application No. 17/277,291, filed as application No. PCT/JP2019/036031 on Sep. 13, 2019, now Pat. No. 11,910,026.

(30) Foreign Application Priority Data

Sep. 28, 2018  (JP) ................. 2018-183912

(51) Int. Cl.
 *H04N 19/96* (2014.01)
 *H04N 19/21* (2014.01)
 *H04N 19/91* (2014.01)

(52) U.S. Cl.
 CPC .......... *H04N 19/96* (2014.11); *H04N 19/21* (2014.11); *H04N 19/91* (2014.11)

(58) Field of Classification Search
 CPC .................................................. H04N 19/96
 (Continued)

(56) References Cited

U.S. PATENT DOCUMENTS

2012/0081241 A1    4/2012 Misra et al.
2014/0307770 A1   10/2014 Jiang et al.
(Continued)

FOREIGN PATENT DOCUMENTS

CN      103141098 A    6/2013
CN      105959014 A    9/2016
(Continued)

OTHER PUBLICATIONS

Nishio, et al., "Information Transformation for Point Cloud", The 7th Forum on Information Tech., 3rd vol. of Lecture proceedings of 7th Forum on Information Technology FIT2008, Papers with peer reviews and general papers, Image recognition and media understanding, Graphics and Image, Human Communication and Interaction, Educational technology, welfare engineering and multimedia application.
(Continued)

*Primary Examiner* — Yulin Sun
(74) *Attorney, Agent, or Firm* — CHIP LAW GROUP

(57) ABSTRACT

The present disclosure relates to an image processing apparatus and a method that enable decoding of encoded data of an octree in various processing orders. The octree corresponding to point cloud data is encoded after the context is initialized for each layer of the octree. Further, a breadth-first order or a depth-first order is selected as the decoding order for the encoded data of the octree corresponding to point cloud data, and the encoded data is decoded in the selected decoding order. The present disclosure can be applied to an image processing apparatus, an electronic apparatus, an image processing method, a program, or the like, for example.

5 Claims, 32 Drawing Sheets

(58) Field of Classification Search
USPC .................................................... 375/240.12
See application file for complete search history.

(56) References Cited

U.S. PATENT DOCUMENTS

| | | | | |
|---|---|---|---|---|
| 2016/0286241 | A1* | 9/2016 | Ridge .................. | H04N 19/186 |
| 2019/0080483 | A1* | 3/2019 | Mammou ............. | G06T 3/4007 |
| 2019/0114829 | A1* | 4/2019 | Abello Rosello ......... | G06T 9/40 |
| 2020/0050175 | A1* | 2/2020 | Carruesco Llorens ...................... | |
| | | | | G06T 15/08 |

FOREIGN PATENT DOCUMENTS

| | | | |
|---|---|---|---|
| CN | 105978575 | A | 9/2016 |
| CN | 106059593 | A | 10/2016 |
| CN | 106060545 | A | 10/2016 |
| CN | 106060549 | A | 10/2016 |
| EP | 1566769 | A2 | 8/2005 |
| EP | 2559240 | A1 | 2/2013 |
| EP | 2622866 | A1 | 8/2013 |
| EP | 3151561 | A1 | 4/2017 |
| EP | 3751520 | A1 | 12/2020 |
| HK | 1181939 | A1 | 11/2013 |
| JP | 2001-052209 | A | 2/2001 |
| JP | 2002-520749 | A | 7/2002 |
| JP | 2005-259139 | A | 9/2005 |
| JP | 2013-539929 | A | 10/2013 |
| JP | 2015-504545 | A | 2/2015 |
| WO | 2012/043883 | A1 | 4/2012 |

OTHER PUBLICATIONS

Mammou, et al., "Binarization of occupancy information in TMC 13", International Organisation for Standardisation, ISO/IEC JTC1/SC29/WG11 MPEG2018/m43592, Coding of Moving Pictures and Audio, XP030196985, Apple Inc., Jul. 2018, 7 pages.

Nakagami, et al., "Point cloud compression technology proposal by Sony", Sony Corporation, XP030260575, International Organisation for Standardisation, ISO/IEC JTC1/SC29/WG11 MPEG2017/M41665, Coding of Moving Pictures and Audio, Oct. 2017, 43 pages.

Yiling, et al., "Introduction to Point Cloud Compression", ZTE Communications, vol. 16, No. 3, XP055687159, Aug. 24, 2018, pp. 3-8.

Partial supplementary European search report of EP Application No. 19864158.1, issued on Jun. 1, 2022, 16 pages.

International Search Report and Written Opinion of PCT Application No. PCT/JP2019/036031, issued on Dec. 10, 2019, 09 pages of English Translation and 08 pages of ISRWO.

Garcia, et al., "Context-Based Octree Coding for Point-Cloud Video", 2017 IEEE International Conference on Image Processing (ICIP), Sep. 20, 2017, pp. 1412-1416.

Koji, et al., "Information Transformation for Point Cloud", 3rd volume of Lecture proceedings of 7th Forum on Information Technology FIT2008, Papers with peer reviews and general papers, Image recognition and media understanding, Graphics and Image, Human Communication and Interaction, Educational technology, welfare engineering and multimedia application, Forum on Information Technology 2008, Aug. 20, 2008, pp. 227-228.

Mekuria, et al., "Design, Implementation and Evaluation of a Point Cloud Codec for Tele Immersive Video", IEEE Transaction on Circuits and Systems, for video Technology, vol. 27, Apr. 4, 2017, pp. 15.

Botsch M et al., "Efficient High Quality Rendering of Point Sampled Geometry", Rendering Techniques 2002, Eurographics Workshop Proceedings. Pisa, Italy, Jun. 26-28, 2002, New York, NY : ACM, US, vol. Workshop 13, Jun. 26, 2002 (Jun. 26, 2002), pp. 53-64, XP001232379, ISBN: 978-1-58113-534-3.

Lasserre (Blackberry) Set Al: "[PCC] Neighbour-dependent entropy coding of occupancy patterns in TMC3", 121. MPEG Meeting; Jan. 22-Jan. 26, 2018; Gwangju; (Motion Picture Expert Group or ISO/IEC JTC1/SC29/WG11 ), No. m42238, Jan. 20, 2018 (Jan. 20, 2018), XP030070580, pages.

Notice of Allowance for U.S. Appl. No. 17/277,291, issued on Oct. 26, 2023, 2 pages.

Notice of Allowance for U.S. Appl. No. 17/277,291, issued on Oct. 12, 2023, 9 pages.

Non-Final Office Action for U.S. Appl. No. 17/277,291, issued on Apr. 27, 2023, 11 pages.

International Preliminary Report on Patentability of PCT Application No. PCT/JP2019/036031, issued on Apr. 8, 2021, 08 pages of English Translation and 04 pages of IPRP.

* cited by examiner

FIG. 3

| TYPE 0 | PERFORM BREADTH-FIRST ENCODING |
| --- | --- |
| TYPE 1 | PERFORM ENCODING SO THAT DECODING CAN BE PERFORMED BY METHOD OTHER THAN BREADTH-FIRST METHOD |
| TYPE 2 | PERFORM INDEPENDENT ENCODING FOR EACH LoD |
| TYPE 3 | ENCODE FIRST NODE OF LoD, USING PROBABILITY TABLE OF PARENT NODE |
| TYPE 4 | PERFORM ENCODING, USING PROBABILITY TABLE OF NODE OF PREVIOUS FRAME |
| | COMBINATION OF TYPES 0 TO 3 |

FIG. 19

| FRAME HEADER (Frame Header) | TYPE (Type) |
| --- | --- |
| | SLICE NUMBER (SliceNum) (* IN CASE WHERE Type = 1 or 4) |
| LoD HEADER (LoD Header) | OFFSET (Offset) |
| | TYPE (Type) (IN CASE WHERE Type OF FRAME HEADER = 4) |
| | SIZE (Size) |

IMAGE PROCESSING APPARATUS AND METHOD

CROSS REFERENCE TO RELATED APPLICATIONS

This application is a divisional application of U.S. patent application Ser. No. 17/277,291 filed on Mar. 17, 2021, which is a is a U.S. National Phase of International Patent Application No. PCT/JP2019/036031 filed on Sep. 13, 2019, which claims priority benefit of Japanese Patent Application No. JP 2018-183912 filed in the Japan Patent Office on Sep. 28, 2018. Each of the above-referenced applications is hereby incorporated herein by reference in its entirety.

TECHNICAL FIELD

The present disclosure relates to an image processing apparatus and a method, and more particularly, to an image processing apparatus and a method that enable decoding of encoded data of an octree in various processing orders.

BACKGROUND ART

As a method for encoding 3D data representing a three-dimensional structure such as a point cloud, for example, there has been encoding using an octree (see Non-Patent Document 1, for example).

In this encoding using an octree, information about each node of the octree is searched and encoded in a breadth-first order. As this encoding, encoding using a context such as arithmetic encoding is performed, for example. Therefore, dependency relationship appears in the processing order, and the encoded data of the respective nodes is processed in the same order (which is the breadth-first order) at the time of decoding.

CITATION LIST

Non-Patent Document

Non-Patent Document 1: R. Mekuria, Student Member IEEE, K. Blom, and P. Cesar, Members IEEE, "Design, Implementation and Evaluation of a Point Cloud Codec for Tele-Immersive Video", tcsvt_paper_submitted_february.pdf

SUMMARY OF THE INVENTION

Problems to be Solved by the Invention

However, if decoding is performed in a breadth-first order, the memory capacity required for storing data might become larger, and the processing order might not be optimal depending on the performance of the hardware of the decoder.

The present disclosure is made in view of such circumstances, and aims to enable decoding of encoded data of an octree in various processing orders.

Solutions to Problems

An image processing apparatus of one aspect of the present technology is an image processing apparatus that includes an encoding unit that encodes an octree corresponding to point cloud data after initializing the context for each layer of the octree.

An image processing method of one aspect of the present technology is an image processing method that includes encoding an octree corresponding to point cloud data after initializing the context for each layer of the octree.

An image processing apparatus of another aspect of the present technology is an image processing apparatus that includes a decoding unit that selects a breadth-first order or a depth-first order as the decoding order for encoded data of an octree corresponding to point cloud data, and decodes the encoded data in the selected decoding order.

An image processing method of another aspect of the present technology is an image processing method that includes selecting a breadth-first order or a depth-first order as the decoding order for encoded data of an octree corresponding to point cloud data, and decoding the encoded data in the selected decoding order.

In the image processing apparatus and method of one aspect of the present technology, the octree corresponding to point cloud data is encoded after the context is initialized for each layer of the octree.

In the image processing apparatus and method of another aspect of the present technology, a breadth-first order or a depth-first order is selected as the decoding order for encoded data of the octree corresponding to point cloud data, and the encoded data is decoded in the selected decoding order.

BRIEF DESCRIPTION OF DRAWINGS

FIG. 3 is a diagram for explaining example types of encoding.

FIG. 19 is a diagram showing an example of header information.

MODES FOR CARRYING OUT THE INVENTION

Figure 1:
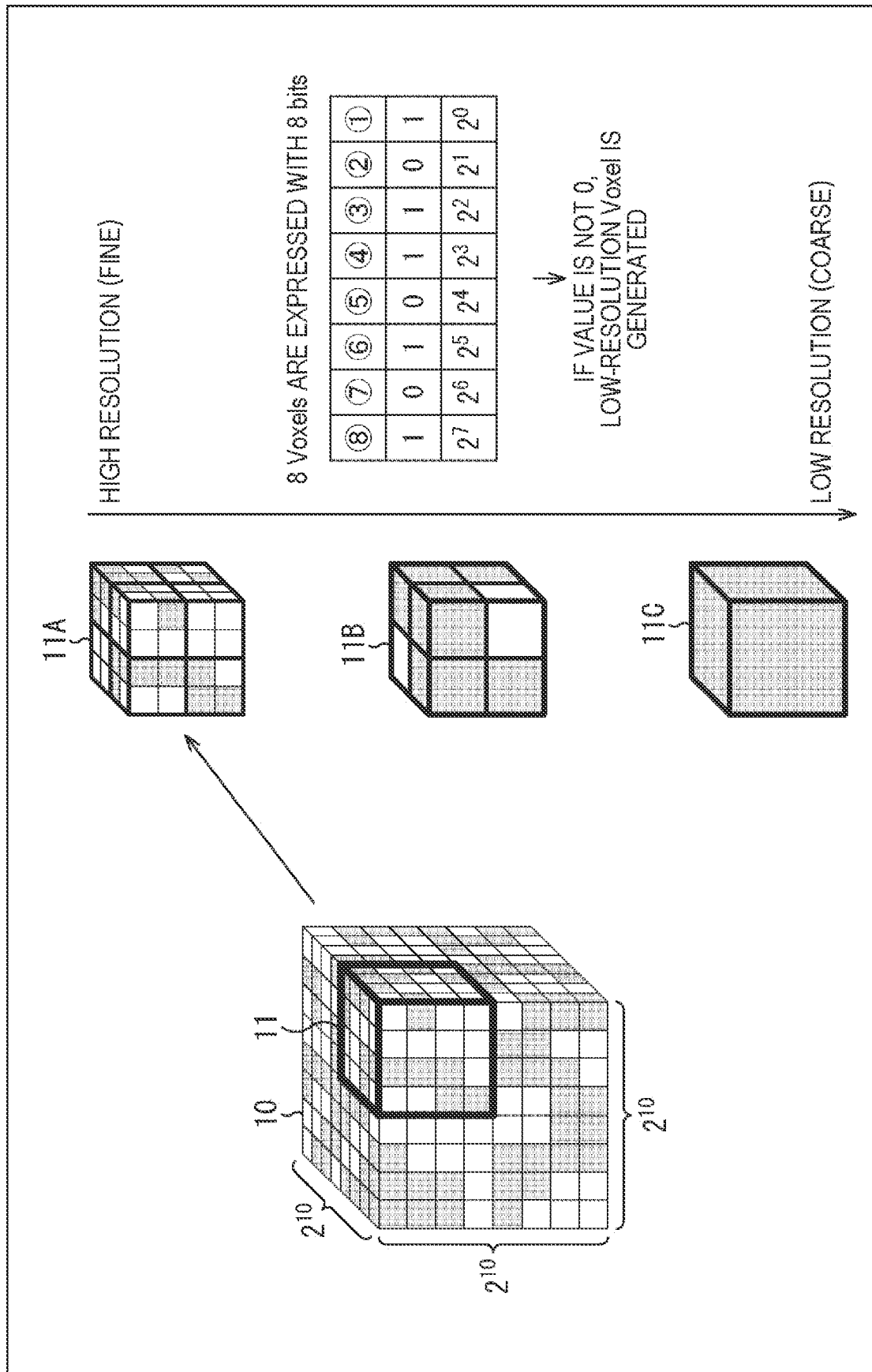
FIG. 1 is a diagram showing an example of generation of an octree.

The following is a description of modes for carrying out the present disclosure (these modes will be hereinafter referred to as embodiments). Note that explanation will be made in the following order.

1. Octree encoding and decoding orders
2. First embodiment (an encoding device)
3. Second embodiment (a decoding device)
4. Notes 1. Octree Encoding and Decoding Orders Documents and the Like That Support Technical Contents and Terms The scope disclosed in the present technology includes not only the contents disclosed in the embodiments but also the contents disclosed in the following non-patent documents that were known at the time of filing.

Non-Patent Document 1: (mentioned above)

Non-Patent Document 2: Ohji Nakagami, Phil Chou, Maja Krivokuca, Khaled Mammou, Robert Cohen, Vladyslav Zakharchenko, and Gaelle Martin-Cocher, "Second Working Draft for PCC Categories 1, 3", ISO/IEC JTC1/SC29/WG11, MPEG 2018/N17533, April 2018, San Diego, US Non-Patent Document 3: TELECOMMUNICATION STANDARDIZATION SECTOR OF ITU (International Telecommunication Union), "Advanced video coding for generic audiovisual services", H.264, April 2017

Non-Patent Document 4: TELECOMMUNICATION STANDARDIZATION SECTOR OF ITU (International Telecommunication Union), "High efficiency video coding", H.265, December 2016

Non-Patent Document 5: Jianle Chen, Elena Alshina, Gary J. Sullivan, Jens-Rainer, and Jill Boyce, "Algorithm Description of Joint Exploration Test Model 4", JVET-G1001_v1, Joint Video Exploration Team (JVET) of ITU-T SG 16 WP 3 and ISO/IEC JTC 1/SC 29/WG 11 7th Meeting: Torino, IT, 13-21 Jul. 2017

That is, the contents disclosed in the non-patent documents listed above are also the basis for determining the support requirements. For example, even in a case where the Quad-Tree Block Structure disclosed in Non-Patent Document 4 and the Quad Tree Plus Binary Tree (QTBT) Block Structure disclosed in Non-Patent Document 5 are not directly disclosed in the embodiments, those structures are within the scope of the present technology, and satisfy the support requirements of the claims. Further, the technical terms such as parsing, syntax, and semantics are also within the scope of disclosure of the present technology, and satisfy the support requirements of the claims, even in a case where those technical terms are not directly described, for example.

<Point Cloud>

There have been 3D data such as point clouds that represent three-dimensional structures with positional information, attribute information, and the like about point clouds, and meshes that are formed with vertices, edges, and planes, and define three-dimensional shapes using polygonal representations.

For example, in the case of a point cloud, a three-dimensional structure (a three-dimensional object) is expressed as a set (a point cloud) of a large number of points. That is, the data of a point cloud (also referred to as point cloud data) is formed with positional information and attribute information (colors and the like, for example) about the respective points in the point group. Accordingly, the data structure is relatively simple, and any desired three-dimensional structure can be expressed with a sufficiently high accuracy with the use of a sufficiently large number of points.

<Quantization of Positional Information Using Voxels>

Since the data amount of such point cloud data is relatively large, an encoding method using voxels has been suggested to reduce the data amount by encoding and the like. A voxel is a three-dimensional region for quantizing positional information about an encoding target.

That is, a three-dimensional region containing a point cloud is divided into small three-dimensional regions called voxels, and each voxel indicates whether or not points are contained therein. For example, in the case of an example shown at the left side in FIG. 1, $2^{10} \times 2^{10} \times 2^{10}$ voxels 10 are set in a three-dimensional space, and each voxel indicates the presence/absence of points (whether or not points are contained therein). In the case of the example shown in FIG. 1, a gray voxel indicates a voxel containing points, and a white voxel indicates a voxel containing no points.

With this arrangement, the positions of the respective points are quantized in voxel units. Accordingly, point cloud data is transformed into such data of voxels (also referred to as voxel data), so that an increase in the amount of information can be prevented (typically, the amount of information can be reduced).

<Octree>

Figure 2:
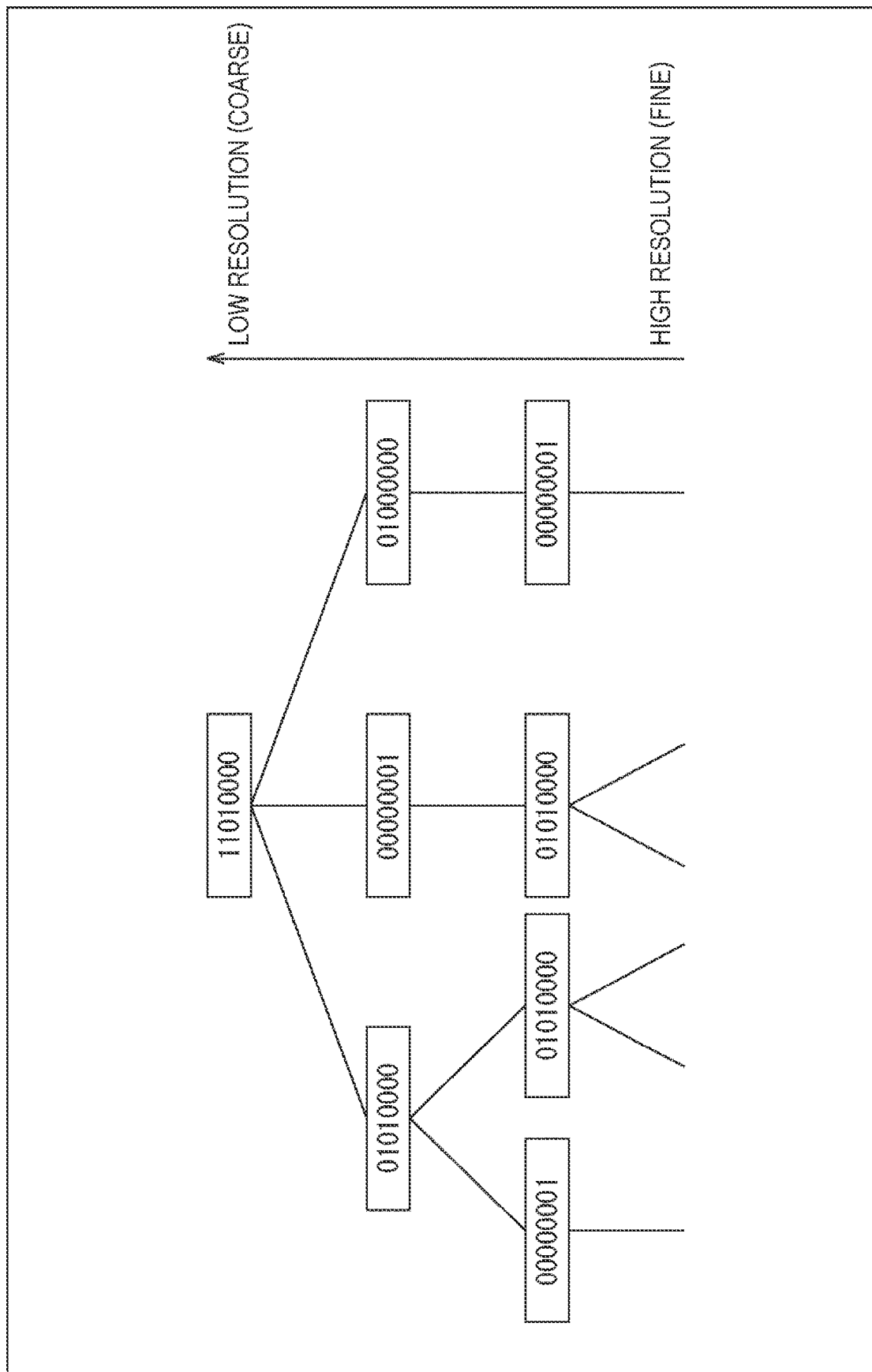
FIG. 2 is a diagram for explaining an example structure of an octree.

Further, construction of an octree using such voxel data has been suggested. An octree is a tree-structured version of voxel data, as shown in FIG. 2, for example. The value of each bit of the lowest nodes of this octree indicates the presence or absence of a point in each voxel. For example, a value "1" indicates a voxel containing points, and a value "0" indicates a voxel containing no points. In the octree, one node corresponds to eight voxels. That is, each node of the octree is formed with 8-bit data, and the eight bits indicate the presence or absence of points in eight voxels.

Then, a higher node of the octree then indicates the presence or absence of points in a region in which the eight voxels corresponding to the lower node belonging to the node are combined into one. That is, the higher node is generated by gathering the voxel information about the lower node.

For example, as for a region 11 indicated by bold lines in the group of voxels 10 at the left side in FIG. 1, information about 2×2×2 voxels 10 is gathered to generate the lowest nodes of the octree, as shown in a region 11A. That is, the lowest nodes each indicating the presence or absence of points in eight voxels 10 are generated.

For example, in a case where the value of such a lowest node is not "0", or where at least one of the eight corresponding voxels contains a point, the higher node of the node is generated. For example, a region (lower-resolution voxels) such as a region 11B that combines the eight voxels is generated, and 2×2×2 pieces of information indicating the presence or absence of points in the low-resolution voxels are combined into a higher node. That is, a higher node indicating the presence or absence of points in the eight low-resolution voxels is generated.

For example, in a case where the value of this higher node is not "0", an even higher node such as a region 11C is generated in a similar manner.

In a case where the value of a node is "0", or where all the eight corresponding voxels contain no points, on the other hand, the node is deleted.

In this manner, a tree structure (an octree) formed with nodes whose values are not "0" is constructed as shown in FIG. 2. That is, an octree can indicate the presence or absence of points in voxels at each resolution. Accordingly, voxel data is transformed into an octree and is then encoded so that the voxel data at various resolutions can be more easily restored at the time of decoding. That is, voxel scalability can be achieved more easily.

Furthermore, as the nodes having the value "0" are omitted as described above, the voxels in the regions without points can be lowered in resolution. Thus, an increase in the amount of information can be further prevented (typically, the amount of information can be reduced).

<Encoding of an Octree>

The data of an octree is encoded, so that an increase in the amount of information can be further prevented (typically, the amount of information can be reduced). In that case, the information (8-bit data) about each node of the octree is subjected to encoding (arithmetic encoding, for example). In arithmetic encoding, a result of encoding of the node processed immediately before that is used as the context to select a probability table, and encoding is performed with the selected probability table. That is, encoding of each node has a dependency on the processing order (search order).

<Breadth-First Order>

Figure 4:
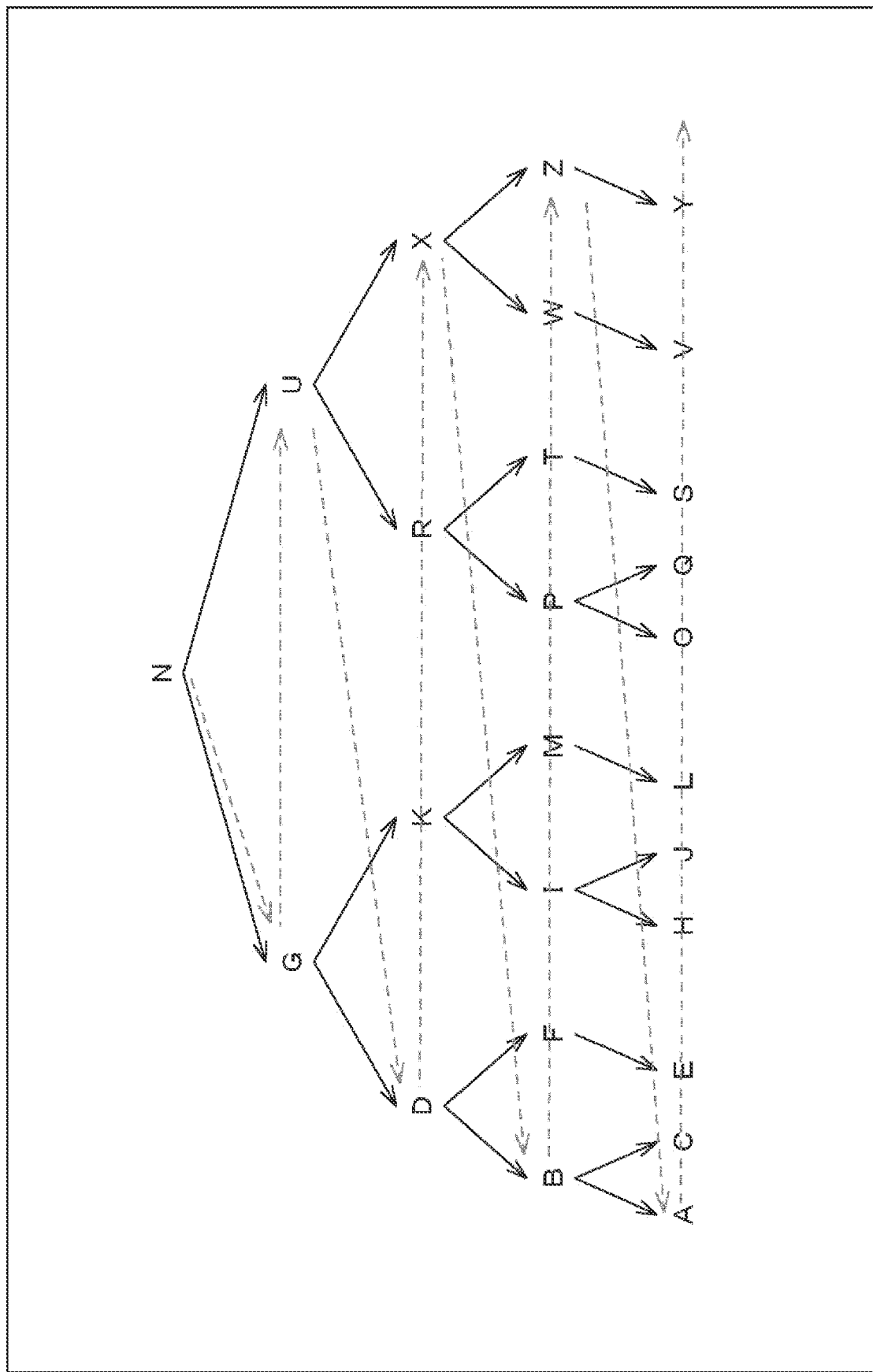
FIG. 4 is a diagram for explaining a breadth-first search.
Figure 5:
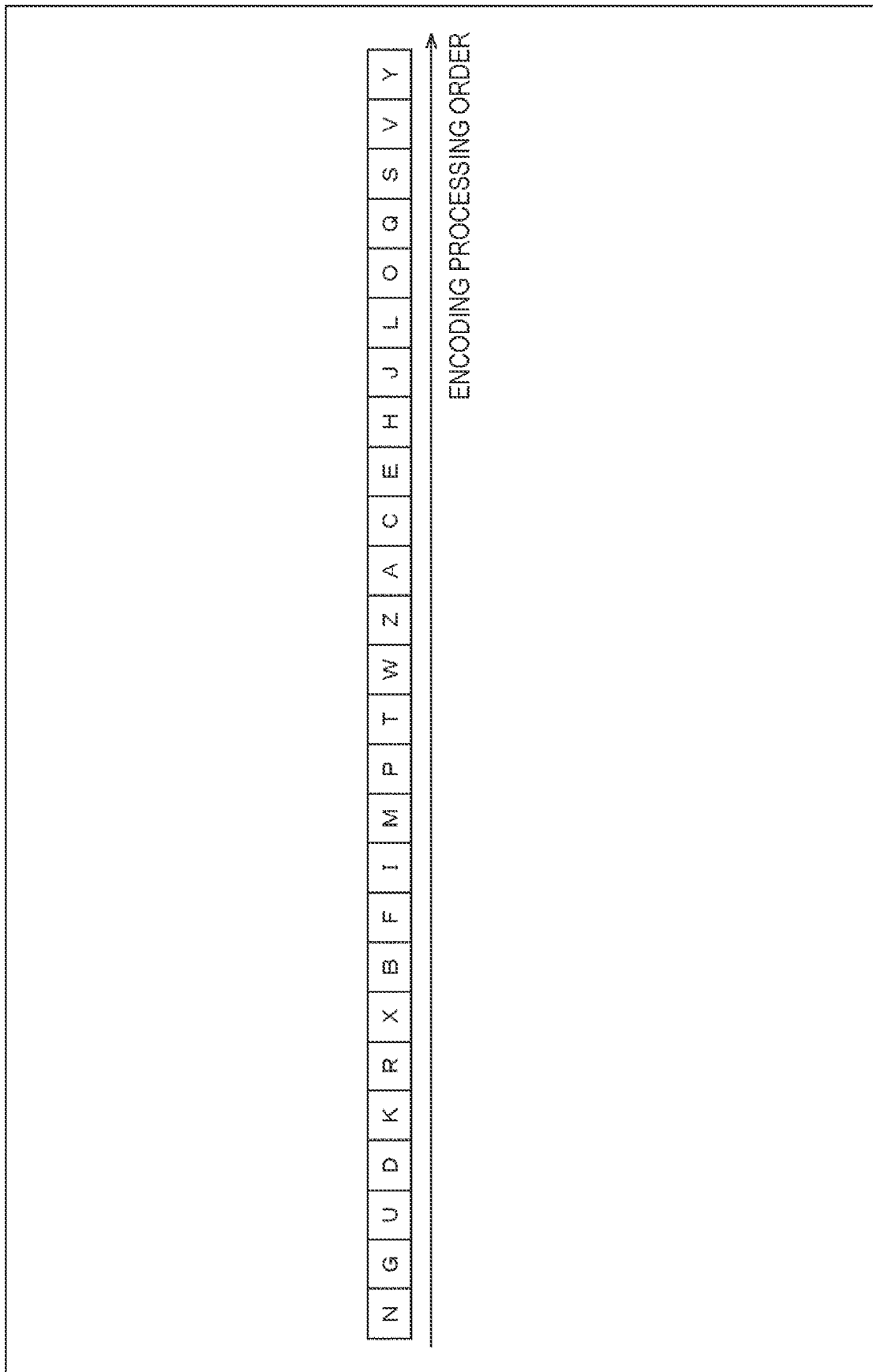
FIG. 5 is a diagram for explaining an example of processing in the breadth-first order.

A suggested method for encoding octree data is a method for searching the respective nodes of an octree in a breadth-first order and encoding the data of each node in the breadth-first order, for example (Type 0 in FIG. 3). The breadth-first order is an order in which the respective nodes are searched one layer (also referred to as LoD) at a time, starting from the highest node of the octree, as indicated by arrows with dashed lines shown in FIG. 4, for example. That is, in the case of the example shown in FIG. 4, the respective nodes are searched in the following order: N, G, U, D, K, R, X, B, F, I, M, P, T, W, Z, A, C, E, H, J, L, O, Q, S, V, and Y. Accordingly, encoding of the data of the respective nodes is performed in the same order as the search order, as shown in FIG. 5.

As described above, in a case where the result of encoding of the node processed immediately before the current node is used as the context at a time of encoding, a dependency relationship appears in the encoding order. In that case, the decoding order is also limited by the dependency relationship. That is, in a case where encoding is performed in a breadth-first order, decoding also needs to be performed in the breadth-first order.

Further, information about the parent node (the node one level higher, to which the node (also referred to as the current node) belongs) is also required in the decoding. Therefore, when decoding is performed on the node A in the octree shown in FIG. 4, for example, information about the node B, which is its parent node, is required. Also, when decoding is performed on the nodes C to Y that are processed after the node A, the information about the nodes F to Z, which are their parent nodes, is required. That is, it is necessary to hold the information about the nodes B to Z at the time of decoding of the node A. In other words, in a case where decoding is performed in the breadth-first order, it is necessary to hold the information about all the nodes of the LoD one level higher at the time of decoding of the node to be processed first (also referred to as the first node) in the processing target layer.

<Depth-First Order>

Figure 6:
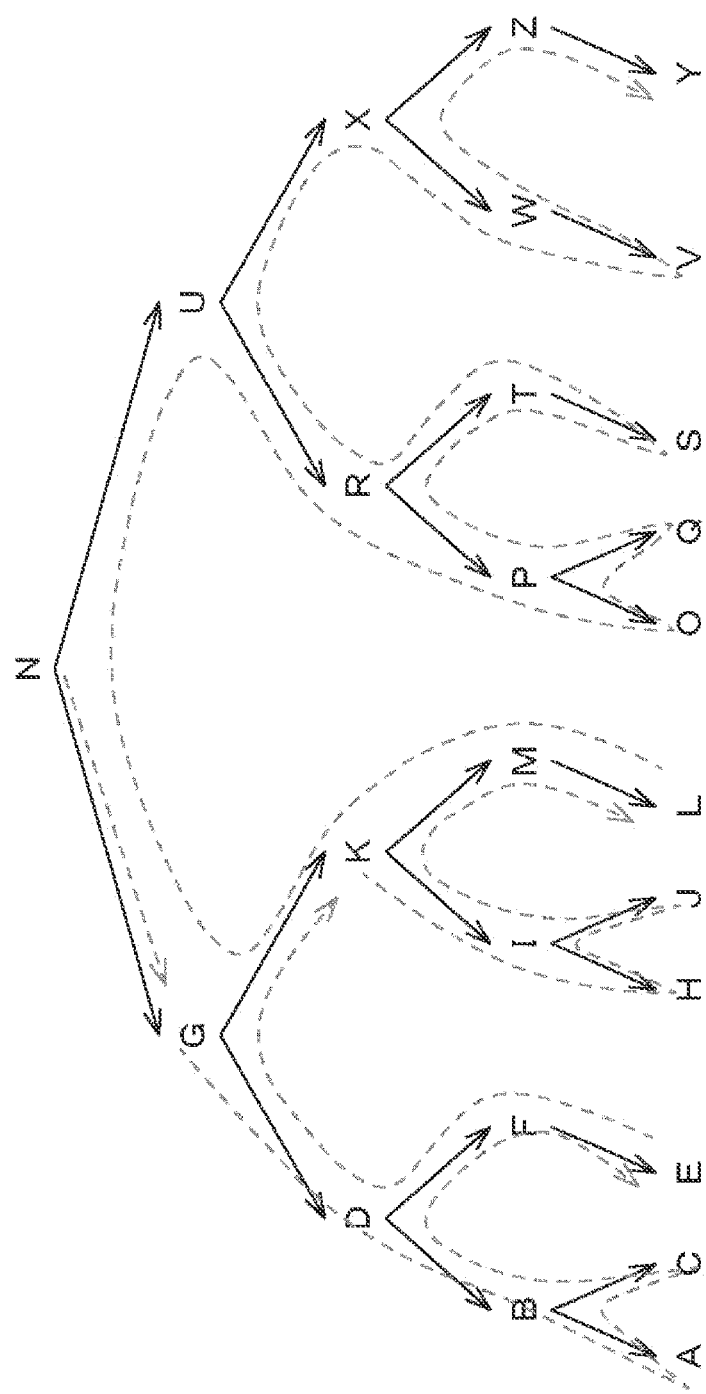
FIG. 6 is a diagram for explaining a depth-first search.
Figure 7:
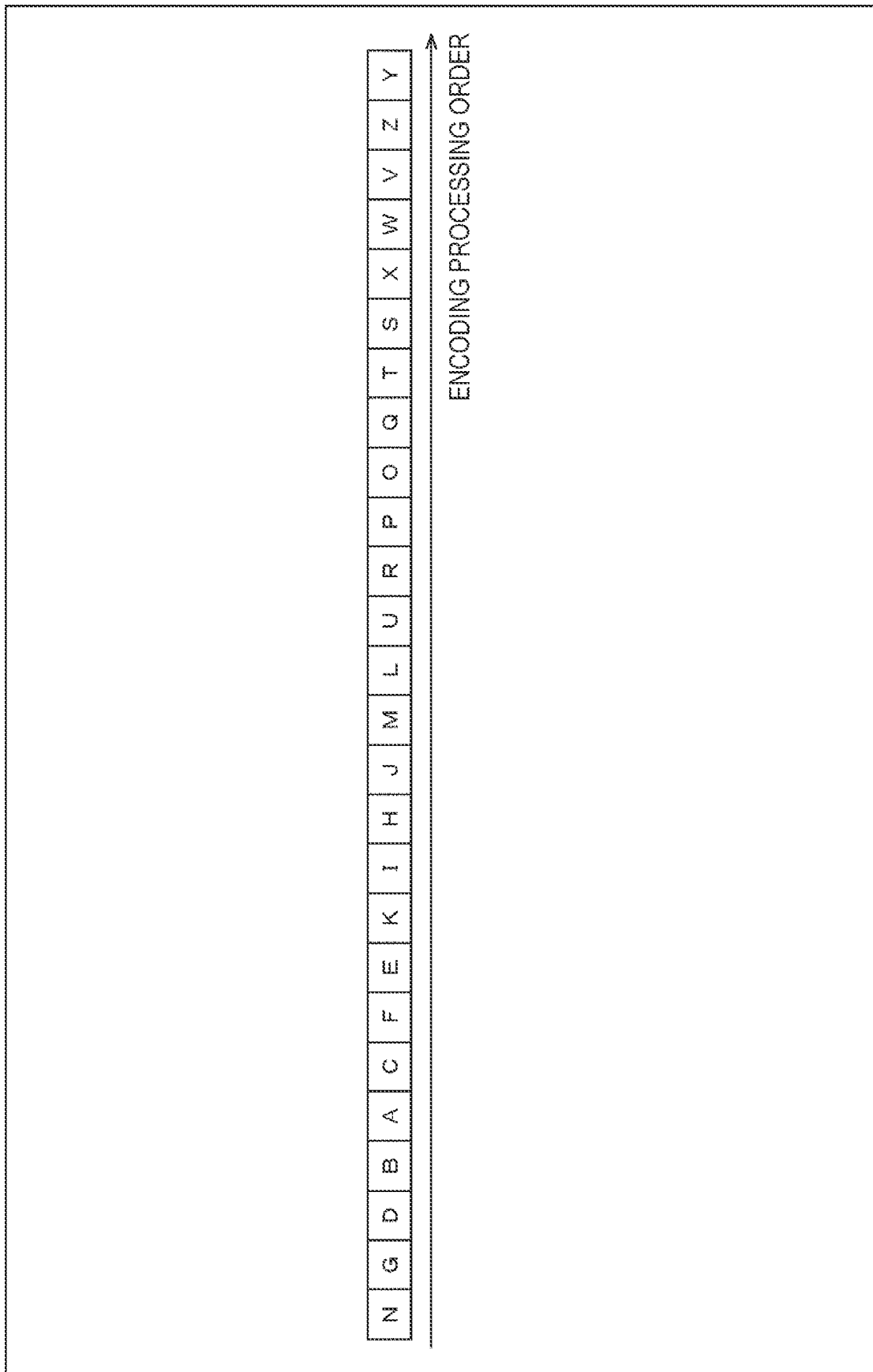
FIG. 7 is a diagram for explaining an example of processing in the depth-first order.

An example search order other than the breadth-first order is a depth-first order, for example. The depth-first order is an order in which the lowest nodes of an octree are searched as soon as possible, as indicated by arrows with dashed lines shown in FIG. 6, for example. In the case of the example shown in FIG. 6, the respective nodes are searched in the following order: N, G, D, B, A, C, F, E, K, I, H, J, M, L, U, R, P, O, Q, T, S, X, W, V, Z, and Y, for example. Accordingly, encoding of the data of the respective nodes is performed in the same order as the search order, as shown in FIG. 7.

For example, in a case where the result of encoding of the node processed immediately before the current node is used as the context at the time of encoding as in arithmetic encoding, decoding needs to be performed in the same order. That is, it is necessary to perform decoding in the depth-first order.

Further, in this case, the information about the parent node is also required in decoding. Therefore, when the node A in FIG. 6 is decoded, the information about the node B is required, for example. Also, when the node F, the node K, and the node U to be processed after the node A are decoded, the information about the node D, the node G, and the node N is required. That is, it is necessary to hold the information about the node N, the node G, the node D, and node D at the time of decoding of the node A. In other words, in a case where decoding is performed in the breadth-first order, it is necessary to hold the information about all the nodes existing in the route from the node of the highest layer (also called the highest node or the root node) to the current node at the time of decoding of the first node in the processing target layer.

<Comparison Between the Breadth-First Order and the Depth-First Order>

An octree is normally wide (the number of nodes in the lowest LoD is larger than the number of LoDs), though it depends on the structure (the number of branches or the number of LoDs (the number of layers)) of the octree. Therefore, in a case where decoding is performed in the breadth-first order, there is a higher possibility of an increase in the memory capacity to be used for decoding (required for data retention) than in a case where decoding is performed in the depth-first order.

Figure 8:
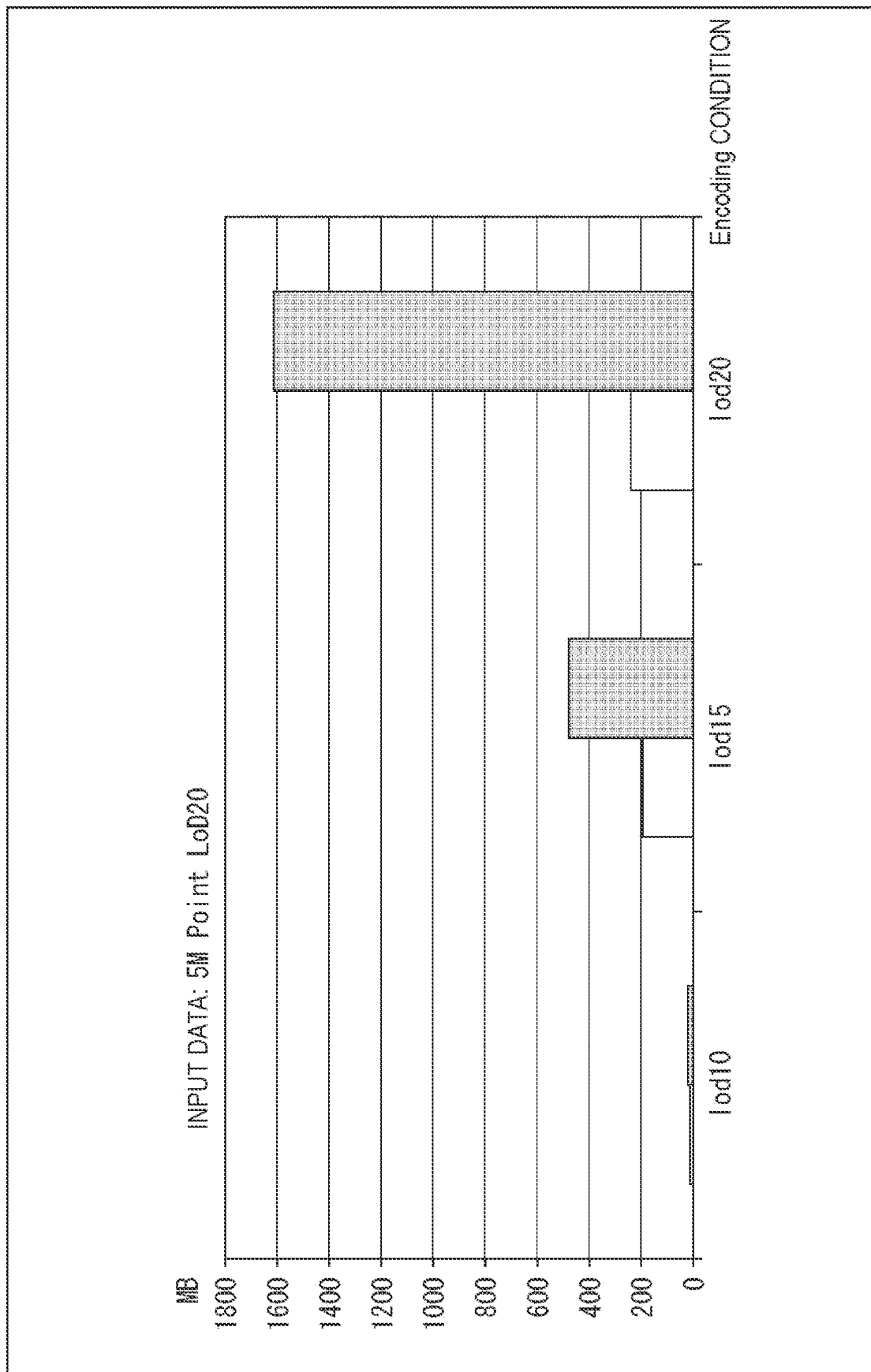
FIG. 8 is a diagram showing a comparative example of memory usage.

FIG. 8 shows an example of comparison of the memory capacity to be used at the time of decoding between the case of the breadth-first order and the case of the depth-first order.

The graph shown in FIG. 8 compares the amounts of memory to be used when encoded data of an octree (5M Points, 20 LoDs) that has five million points and 20 LoDs (depth) is decoded. The set of bars at the left in the graph indicates the amount of memory (lod10) in a case where the data of the 10 LoDs (10 layers) from the top is decoded, the set of bars at the center of the graph indicates the amount of memory (lod15) in a case where the data of the 15 LoDs (15 layers) from the top is decoded, and the set of bars at the right in the graph indicates the amount of memory (lod20) in a case where the data for the 20 LoDs (20 layers) from the top is decoded. Further, the white bar at the left side in each set indicates the amount of memory in the case of the depth-first order, and the gray bar at the right side indicates the amount of memory in the case of the breadth-first order.

As is apparent from the graph in FIG. 8, in each case, the amount of memory used for decoding is larger in the case of the breadth-first order than in the case of the depth-first order. Further, the larger the octree (the larger the number of nodes), the larger the difference.

When the amount of memory required for decoding increases in this manner, it becomes necessary for the decoder to be equipped with a large-capacity memory, which might lead to an increase in the production cost of the decoder. In addition to that, there is a possibility that it will be difficult to reduce the size of the decoder. Further, the amount of memory that can be used for processing other than holding the information about processed nodes becomes smaller, and therefore, there is a possibility that the decoding speed will become lower.

However, the extent of the influence of these aspects depends on the structure (the number of LoDs, the number of nodes, and the like, for example) of an octree and the performance (the memory capacity and the like, for example) of the hardware of the decoder. For example, in a case where the memory capacity of the decoder is sufficiently larger than the amount of memory to be used at the time of decoding, the influence of fluctuations of the processing load depending on search orders is small.

Further, a decrease in coding efficiency can be prevented (typically, the coding efficiency can be increased) more effectively in a case where encoding is performed in the breadth-first order than in a case where encoding is performed in the depth-first order.

<Optimal Search Order>

That is, the optimal search order depends on the structure of the octree, the performance (such as the memory capacity) of the hardware of the decoder, what is prioritized (for example, an increase in coding efficiency is prioritized, or a decrease in the memory capacity of the decoder is prioritized), and the like. That is, enabling decoding in the breadth-first order is not always the best. In other words, enabling decoding in the breadth-first order is not necessarily the best.

Therefore, as described in the second row from the top in the table shown in FIG. 3, an octree is encoded so that the encoded data of the octree can be decoded by a method other than the breadth-first method. That is, an octree is encoded so that the encoded data of the octree can be decoded in a wider variety of processing orders.

More specifically, an octree corresponding to point cloud data is encoded after the context is initialized (reset) for each layer of the octree, for example. For example, an image processing apparatus that encodes an octree includes an encoding unit that encodes an octree corresponding to point cloud data after initializing (resetting) the context for each layer of the octree.

In this manner, it is possible to allow the decoder to decode the encoded data of the octree in a wider variety of processing orders. Thus, the decoder can be made to decode the encoded data of the octree in a more appropriate processing order.

Further, the breadth-first order or the depth-first order is selected as the decoding order for the encoded data of the octree corresponding to point cloud data, and the encoded data is decoded in the selected decoding order, for example. An image processing apparatus that decodes the encoded data of the octree includes a decoding unit that selects the breadth-first order or the depth-first order as the decoding order for the encoded data of the octree corresponding to point cloud data, and decodes the encoded data in the selected decoding order, for example.

With this arrangement, the decoder can decode the encoded data of the octree in a wider variety of processing orders. That is, the decoder can select a more appropriate processing order, and decode the encoded data of the octree in the more appropriate processing order.

<Type 1>

A method for encoding an octree corresponding to point cloud data after initializing the context for each layer of the octree may be a method of encoding the respective layers of an octree independently of one another as described in the third row from the top in FIG. 3, for example (the type 1).

Figure 9:
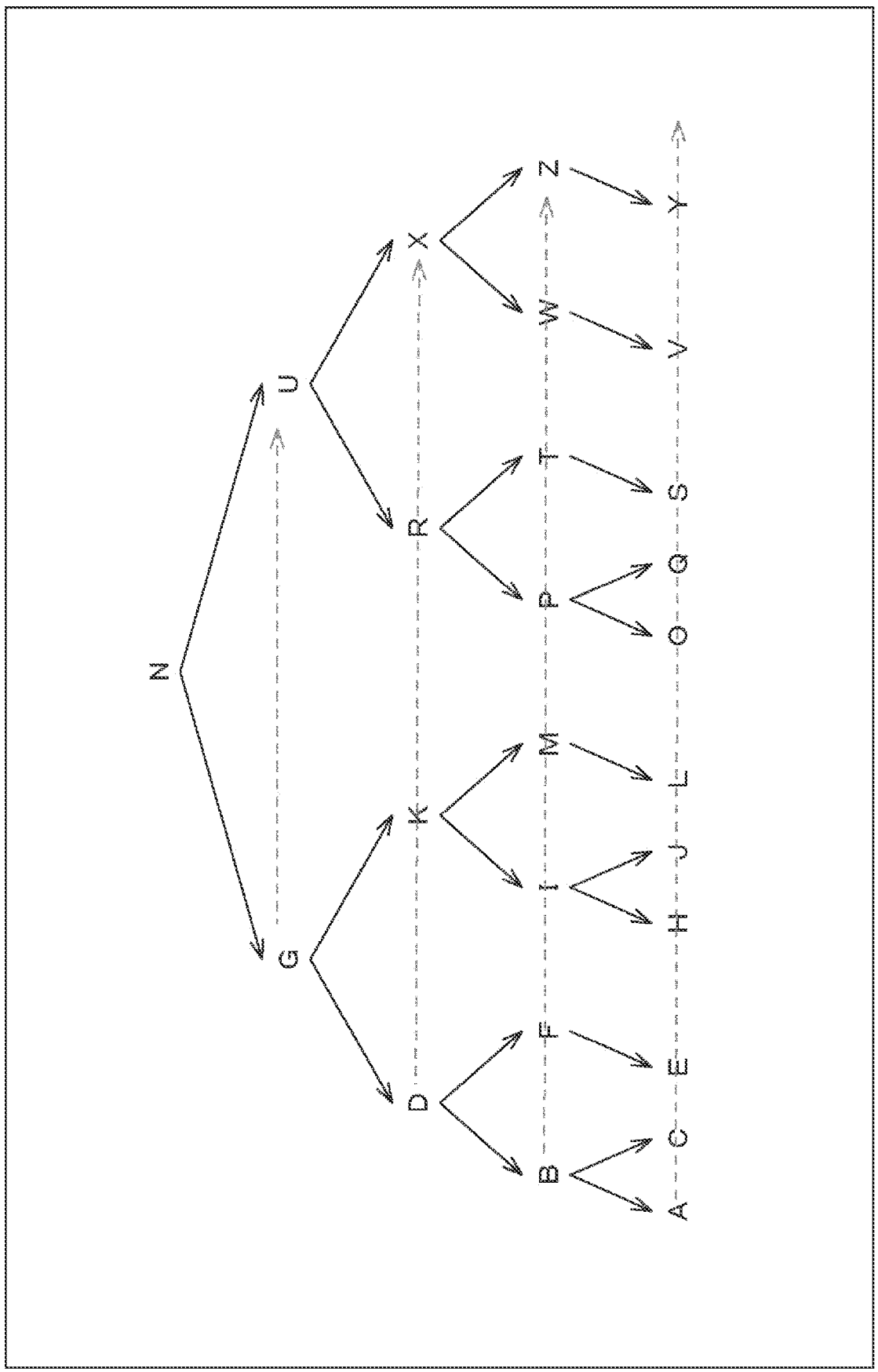
FIG. 9 is a diagram for explaining the search order of a type 1.
Figure 10:
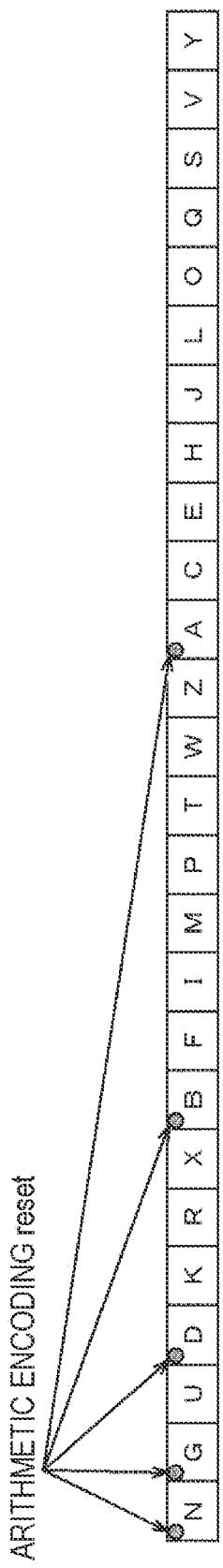
FIG. 10 is a diagram for explaining an example of processing in the search order of the type 1.

For example, as indicated by arrows with dashed lines in FIG. 9, encoding is performed without reference between the LoDs of an octree. That is, each LoD is encoded independently. More specifically, as shown in FIG. 10, for example, arithmetic encoding is performed in the same order as the breadth-first order, and further, the arithmetic encoding (the context) is initialized at the first node of each LoD.

That is, in the case of this example, arithmetic encoding is performed on the data of the respective nodes in the following order: N, G, U, D, K, R, X, B, F, I, M, P, T, W, Z, A, C, E, H, J, L, O, Q, S, V, and Y. In the arithmetic encoding, the context is obtained from a result of encoding of the previous node, a probability table is selected according to the context, and an arithmetic encoding process is performed with the selected probability table. However, in the case of this type 1, the arithmetic encoding (the context) is initialized at the node N, the node G, the node D, the node B, and the node A. In the case of this type 1, the respective nodes can be encoded LoD by LoD as in the case of the breadth-first order described above with reference to FIGS. 4 and 5. Accordingly, the encoder can prevent a decrease in coding efficiency (or typically increase the coding efficiency).

Also, in the case of this type 1, the arithmetic encoding is initialized at the first node of each LoD. Accordingly, the encoder can perform arithmetic encoding on the first node, without referring to the result of processing of the last node of the LoD one level higher. That is, the encoder can process each LoD independently. Accordingly, the encoder can parallelize the encoding processes for the respective LoDs (encode the respective LoDs in parallel with one another), for example. In a case where a plurality of processes can be performed in parallel, for example, the encoder can perform encoding at a higher speed by arithmetically encoding the respective LoDs in parallel in this manner.

Further, as arithmetic encoding is performed on the respective LoDs independently of one another as described above (there is no dependency relationship in the arithmetic encoding between the first node of each LoD and the last node of the LoD one level higher), the processing order (also referred to as the decoding order) in the decoding (or arithmetic decoding) compatible with this arithmetic encoding is not necessarily the breadth-first order in the case of this type 1. For example, the decoder can select the breadth-first order (FIG. 5) or the depth-first order (FIG. 7) as the decoding order for the octree encoded data generated by encoding of this type 1. That is, the decoder can decode the encoded data of the octree in a wider variety of processing orders. Thus, the decoder can select a more appropriate processing order, and decode the encoded data of the octree in the more appropriate processing order.

Note that, in the case of this type 1, a dependency relationship between parent and child noes is necessary for restoring the positions. That is, information about the parent node of the processing target node is necessary. Further, in a bitstream, the header information may contain information indicating the data position of the first node of each LoD so that the encoded data of the first node of the processing target LoD can be directly accessed. With this arrangement, it is possible to more easily access (or read out) the encoded data of the first node of a desired LoD in the bitstream, by referring to the header information. That is, it is possible to perform decoding at a higher speed (or prevent an increase in the load of the decoding process (or typically reduce the load of the decoding process)).

<Type 2>

A method for encoding an octree corresponding to point cloud data after initializing the context for each layer of the octree may be a method of encoding the first node of each LoD of an octree by using the probability table of its parent node, as shown in the fourth row from the top in FIG. 3, for example (the type 2).

Figure 11:
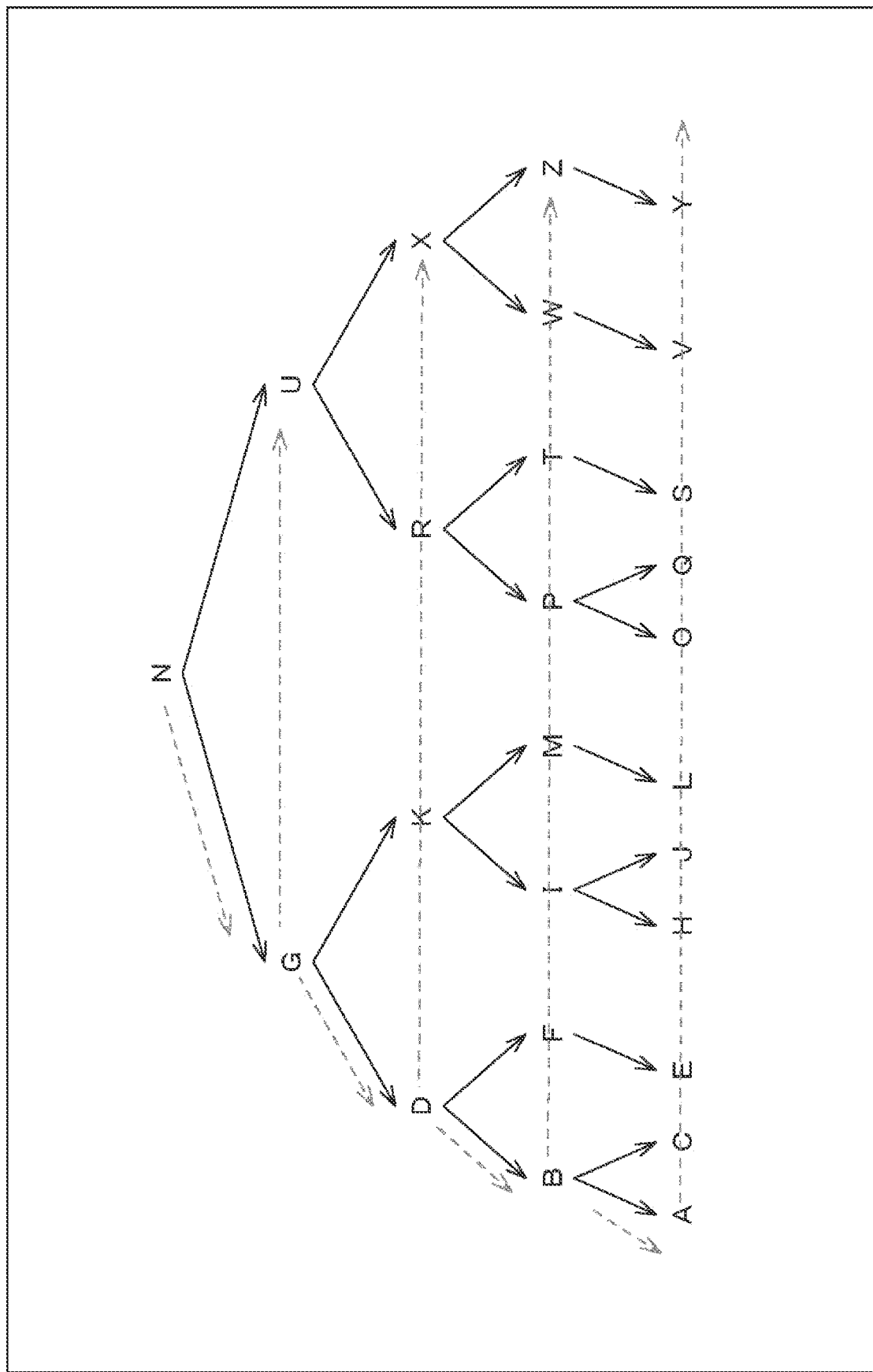
FIG. 11 is a diagram for explaining the search order of a type 2.
Figure 12:
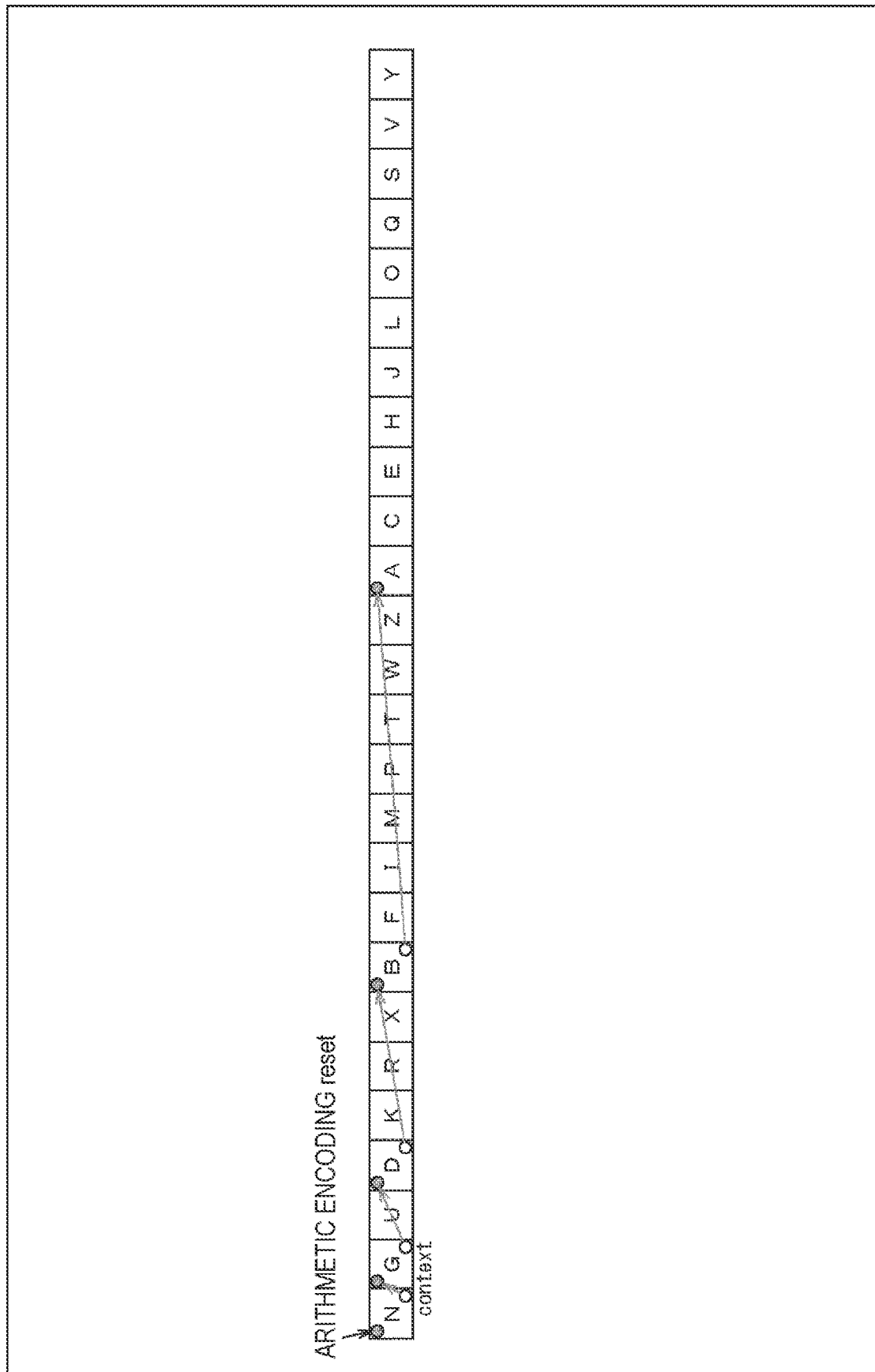
FIG. 12 is a diagram for explaining an example of processing in the search order of the type 2.

As indicated by arrows with dashed lines in FIG. 11, for example, in encoding of the first node of each LoD of an octree, the probability table of its parent node is used. More specifically, as shown in FIG. 12, for example, arithmetic encoding is performed in the same order as the breadth-first order, and further, the arithmetic encoding (the context) is initialized at the first node of each LoD. Furthermore, the probability table of the parent node is inherited (copied) at the first node of each LoD, and arithmetic encoding is performed with the probability table.

That is, in the case of this example, arithmetic encoding is performed on the data of the respective nodes in the following order: N, G, U, D, K, R, X, B, F, I, M, P, T, W, Z, A, C, E, H, J, L, O, Q, S, V, and Y. However, in the case of this type 2, the arithmetic encoding (the context) is initialized at the node N, the node G, the node D, the node B, and the node A. Further, at the node N, the node G, the node D, the node B, and the node A, the probability tables of the respective parent nodes (the node N in the case of the node G, the node G in the case of the node D, the node D in the case of the node B, and the node B in the case of the node A) are duplicated (copied), and the duplicated probability tables are used in the arithmetic encoding.

With this arrangement, the respective nodes can be encoded LoD by LoD as in the case of the type 1. Accordingly, the encoder can prevent a decrease in coding efficiency (or typically increase the coding efficiency).

Also, in the case of this type 2, the arithmetic encoding is initialized at the first node of each LoD as in the case of the type 1. Accordingly, the encoder can perform arithmetic encoding on the first node, without referring to the result of processing of the last node of the LoD one level higher.

Further, in the case of this type 2, the probability table of the parent node is used in the arithmetic encoding of the first node of each LoD. Accordingly, the encoder can prevent a decrease in coding efficiency (or typically increase the coding efficiency) more effectively than in the case of the type 1.

Also, in the case of this type 2, there is a dependency relationship between the first nodes of the respective LoDs, but the other nodes are independent of one another between the LoDs. Accordingly, for the nodes other than the first nodes of the respective LoDs, the encoder can perform arithmetic encoding on the respective LoDs in parallel with one another. In a case where a plurality of processes can be performed in parallel, for example, the encoder can perform encoding at a higher speed by arithmetically encoding the respective LoDs in parallel in this manner.

Further, there is no arithmetic encoding dependency between the first node of each LoD and the last node of the LoD one level higher as in the case of the type 1. Accordingly, the decoding order in arithmetic decoding in the case of this type 2 is not necessarily the breadth-first order either. For example, the decoder can select the breadth-first order (FIG. 5) or the depth-first order (FIG. 7) as the decoding order for the octree encoded data generated by encoding of this type 2. That is, the decoder can decode the encoded data of the octree in a wider variety of processing orders. Thus, the decoder can select a more appropriate processing order, and decode the encoded data of the octree in the more appropriate processing order.

Note that, in the case of this type 2, a dependency relationship between parent and child noes is necessary for restoring the positions. That is, information about the parent node of the processing target node is necessary. Further, in a bitstream, the header information may contain information indicating the data position of the first node of each LoD so that the encoded data of the first node of the processing target LoD can be directly accessed. With this arrangement, it is possible to more easily access (or read out) the encoded data of the first node of a desired LoD in the bitstream, by referring to the header information. That is, it is possible to perform decoding at a higher speed (or prevent an increase in the load of the decoding process (or typically reduce the load of the decoding process)).

<Type 3>

A method for encoding an octree corresponding to point cloud data after initializing the context for each layer of the octree may be a method of encoding the first node of each LoD of an octree by using the probability table of a predetermined node of the previous frame, as shown in the fifth row from the top in FIG. 3, for example (the type 3).

Figure 13:
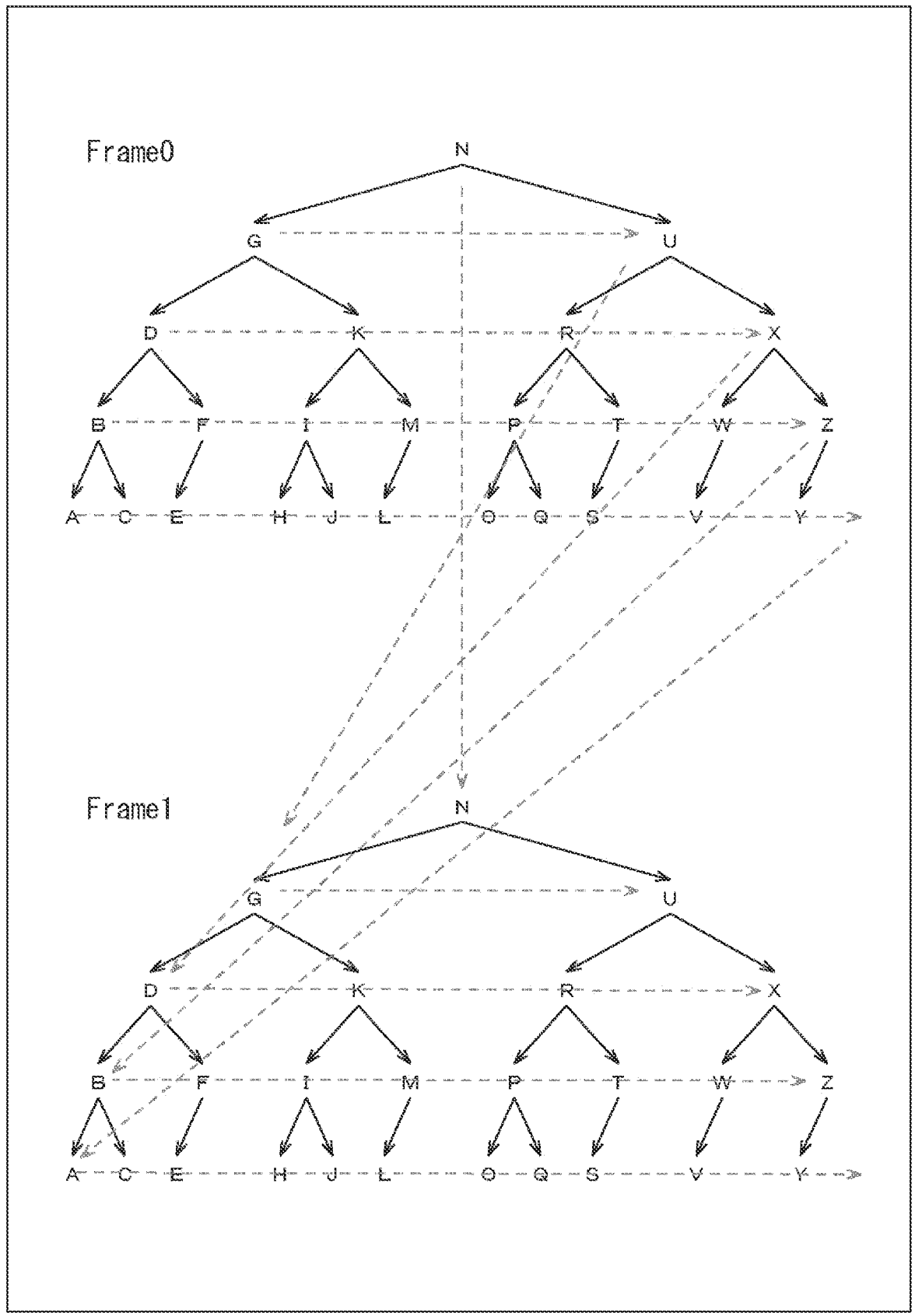
FIG. 13 is a diagram for explaining an example of processing in the search order of a type 3.
Figure 14:
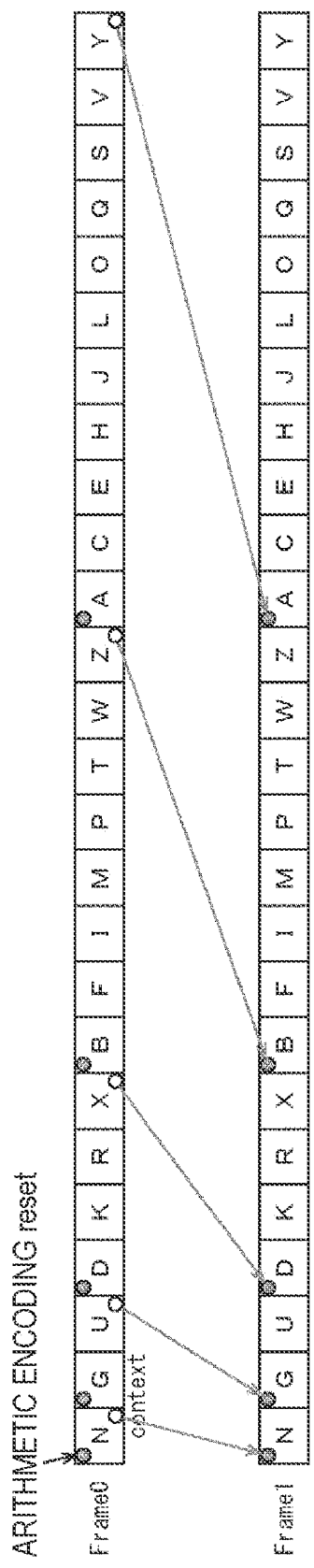
FIG. 14 is a diagram for explaining an example of processing in the search order of the type 3.

For example, as indicated by arrows with dashed lines in FIG. 13, in encoding of the first node of each LoD of an octree of Frame 1, the probability table of a predetermined node of an octree of the previous frame (Frame 0) is used. More specifically, as shown in FIG. 14, for example, arithmetic encoding is performed on the respective nodes of Frame 1 in the same order as the breadth-first order. Further, the arithmetic encoding (the context) is initialized at the first node of each of the LoDs. Furthermore, the probability table of a predetermined node of Frame 0 is inherited (copied) at the first node of each LoD, and arithmetic encoding is performed with the probability table.

For example, as in the example shown in FIG. 13, the probability table of the last node of the same LoD as the processing target node in Frame 0 may be duplicated (copied).

That is, in the case of this example, arithmetic encoding is performed on the data of the respective nodes of Frame 1 in the following order: N, G, U, D, K, R, X, B, F, I, M, P, T, W, Z, A, C, E, H, J, L, O, Q, S, V, and Y. However, in the case of this type 3, the arithmetic encoding (the context) is initialized at the node N, the node G, the node D, the node B, and the node A. Also, in a case where the node N in Frame 1 is the processing target, the probability table of the node N in Frame 0 is duplicated (copied), and arithmetic encoding is performed with the duplicated probability table. Further, in a case where the node G in Frame 1 is the processing target, the probability table of the node U in Frame 0 is duplicated (copied), and arithmetic encoding is performed with the duplicated probability table. Also, in a case where the node D in Frame 1 is the processing target, the probability table of the node X in Frame 0 is duplicated (copied), and arithmetic encoding is performed with the duplicated probability table. Further, in a case where the node B in Frame 1 is the processing target, the probability table of the node Z in Frame 0 is duplicated (copied), and arithmetic encoding is performed with the duplicated probability table. Also, in a case where the node A in Frame 1 is the processing target, the probability table of the node Y in Frame 0 is duplicated (copied), and arithmetic encoding is performed with the duplicated probability table.

With this arrangement, the respective nodes can be encoded LoD by LoD as in the case of the type 1. Accordingly, the encoder can prevent a decrease in coding efficiency (or typically increase the coding efficiency).

Also, in the case of this type 3, the arithmetic encoding is initialized at the first node of each LoD as in the case of the type 1. Accordingly, the encoder can perform arithmetic encoding on the first node, without referring to the result of processing of the last node of the LoD one level higher.

Further, in the case of this type 3, the probability table of the last node of the same LoD in the previous frame is used in the arithmetic encoding of the first node of each LoD, as in the example shown in FIGS. 13 and 14. Accordingly, the encoder can perform arithmetic encoding using a probability table that has been updated a larger number of times than in the case of the type 2. Thus, the encoder can prevent a decrease in coding efficiency (or typically increase the coding efficiency) more effectively than in the case of the type 2.

Also, in the case of this type 3, arithmetic encoding is performed on the respective LoDs independently of one another as in the case of the type 1, and thus, the encoder can perform the arithmetic encoding of the respective LoDs in parallel with one another. For example, in a case where the encoder can process a plurality of processes in parallel, the encoder can perform encoding at a higher speed by arithmetically encoding the respective LoDs in parallel in this manner.

Also, in the case of this type 3, there is no arithmetic encoding dependency between the first node of each LoD and the last node of the LoD one level higher as in the case of the type 1. Accordingly, the processing order (also referred to as the decoding order) in the decoding (which is arithmetic decoding) corresponding to this arithmetic encoding can be either the breadth-first order or the depth-first order. That is, the decoder can perform arithmetic decoding on the encoded data of the respective nodes in the processing order shown in FIG. 5, or can perform arithmetic decoding on the encoded data of the respective nodes in the processing order shown in FIG. 7. That is, the decoder can decode the encoded data of the octree in a wider variety of processing orders. Thus, the decoder can select a more appropriate processing order, and decode the encoded data of the octree in the more appropriate processing order.

Note that, in the case of this type 3, a dependency relationship between parent and child noes is necessary for restoring the positions. That is, information about the parent node of the processing target node is necessary. Further, in a bitstream, the header information may contain information indicating the data position of the first node of each LoD so that the encoded data of the first node of the processing target LoD can be directly accessed. With this arrangement, it is possible to more easily access (or read out) the encoded data of the first node of a desired LoD in the bitstream, by referring to the header information. That is, it is possible to perform decoding at a higher speed (or prevent an increase in the load of the decoding process (or typically reduce the load of the decoding process)).

Figure 15:
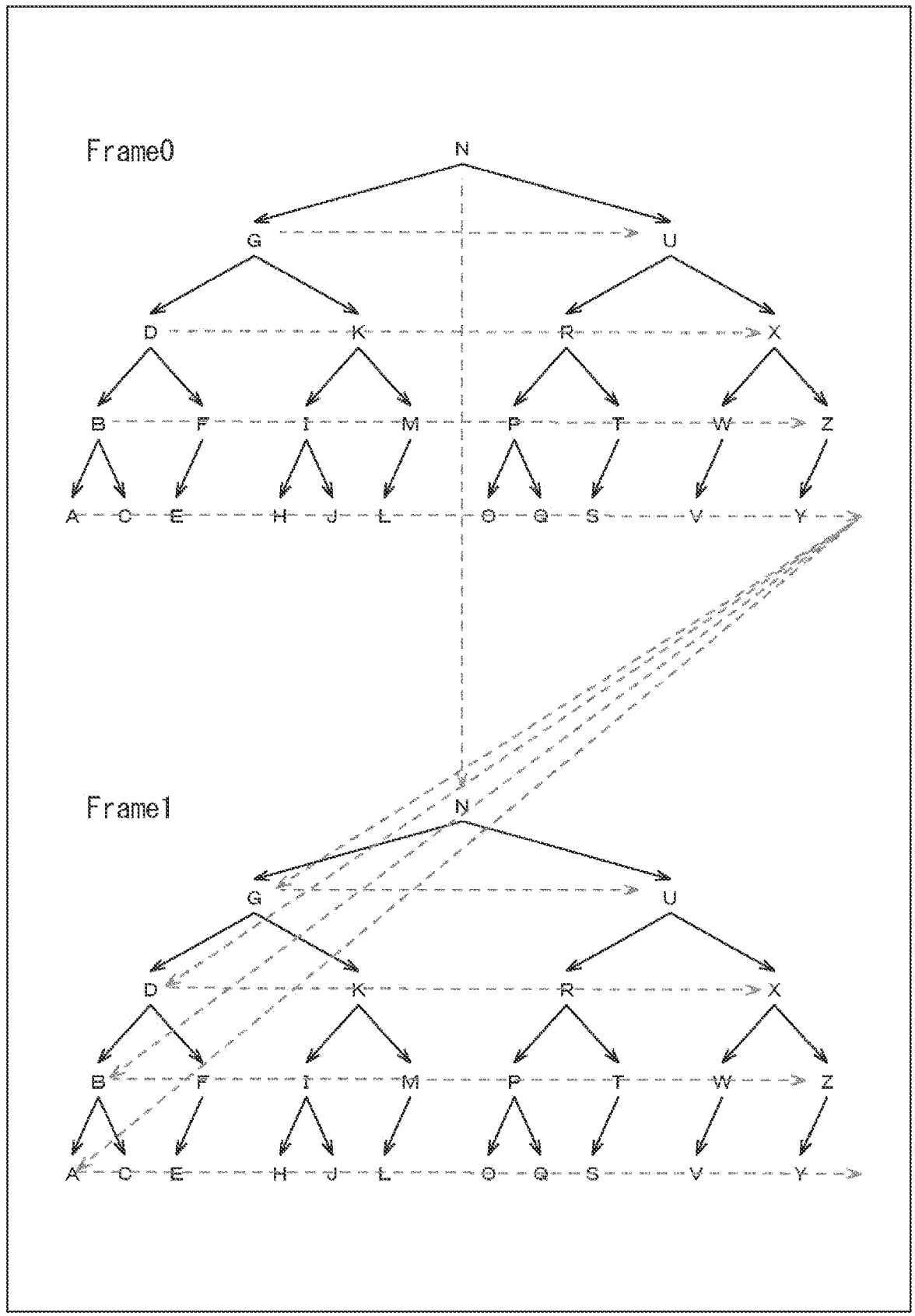
FIG. 15 is a diagram for explaining an example of processing in the search order of the type 3.
Figure 16:
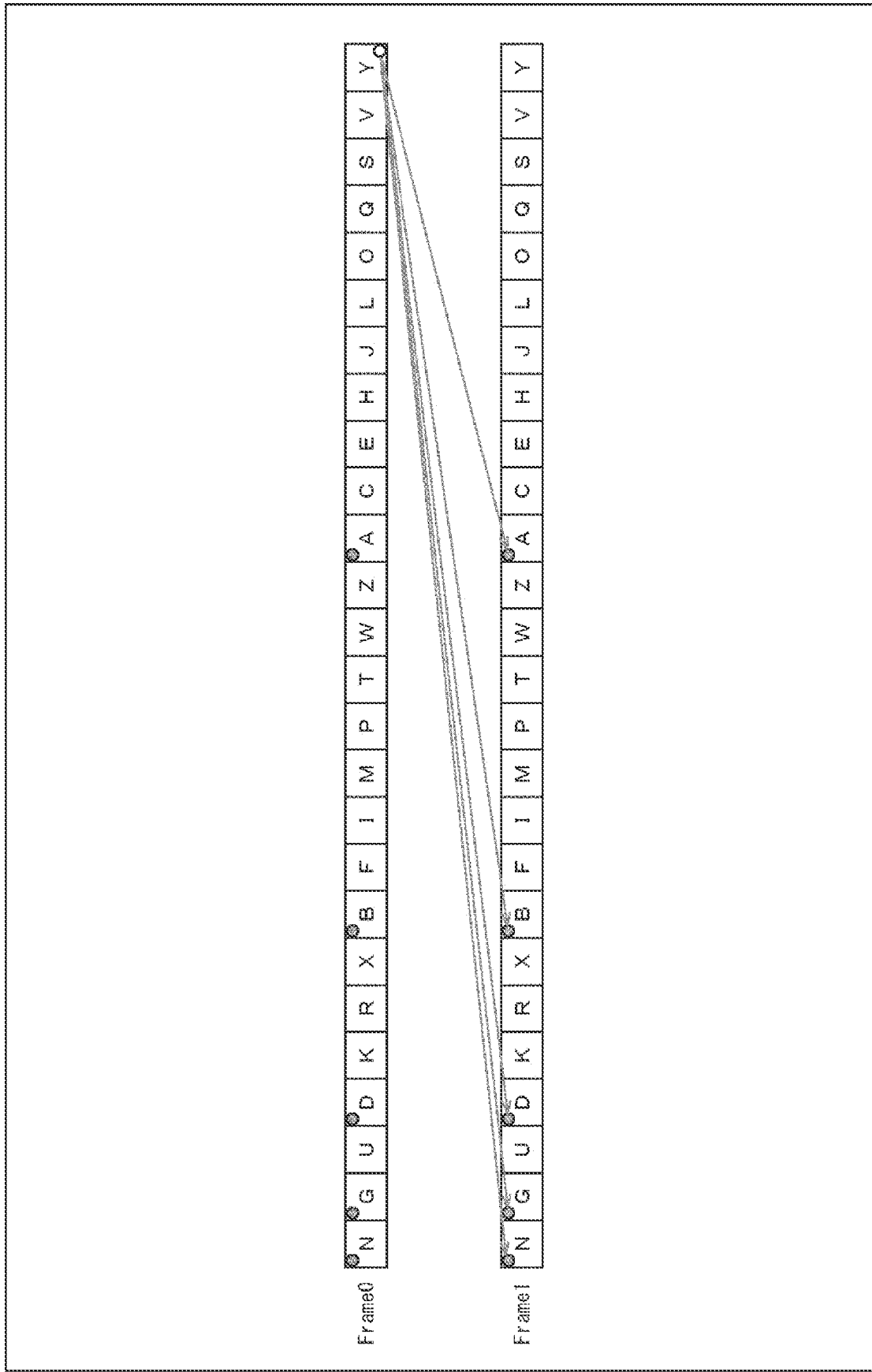
FIG. 16 is a diagram for explaining an example of processing in the search order of the type 3.

Note that a node whose probability table is to be referred to (a node to be referred to) is any of the nodes in the previous frame (the probability table of any desired node can be inherited and be used in arithmetic decoding). For example, as in an example shown in FIG. 15, the probability table of the last node in Frame 0 may be duplicated (copied). For example, as shown in FIG. 16, in a case where the node N, the node G, the node D, the node B, or the node A in Frame 1 is the processing target, the arithmetic encoding may be initialized, the probability table of the node Y, which is the last node in Frame 0, may be duplicated (copied), and further, arithmetic encoding may be performed with the duplicated probability table.

With this arrangement, arithmetic encoding can be performed with a probability table that has been updated a larger number of times than in the case of the other example described above with reference to FIGS. 13 and 14. Thus, the encoder can prevent a decrease in coding efficiency (or typically increase the coding efficiency) more effectively.

Note that, in the above description, the probability table of the previous frame processed immediately before the current frame is referred to. However, the reference frame for this probability table is any appropriate frame. For example, the probability table of a desired node in a frame that was processed two or more frames before may be referred to.

<Type 4>

Further, as shown in the sixth row from the top in FIG. 3, for example, the types 0 to 3 described above may be used in combination (the type 4).

Figure 17:
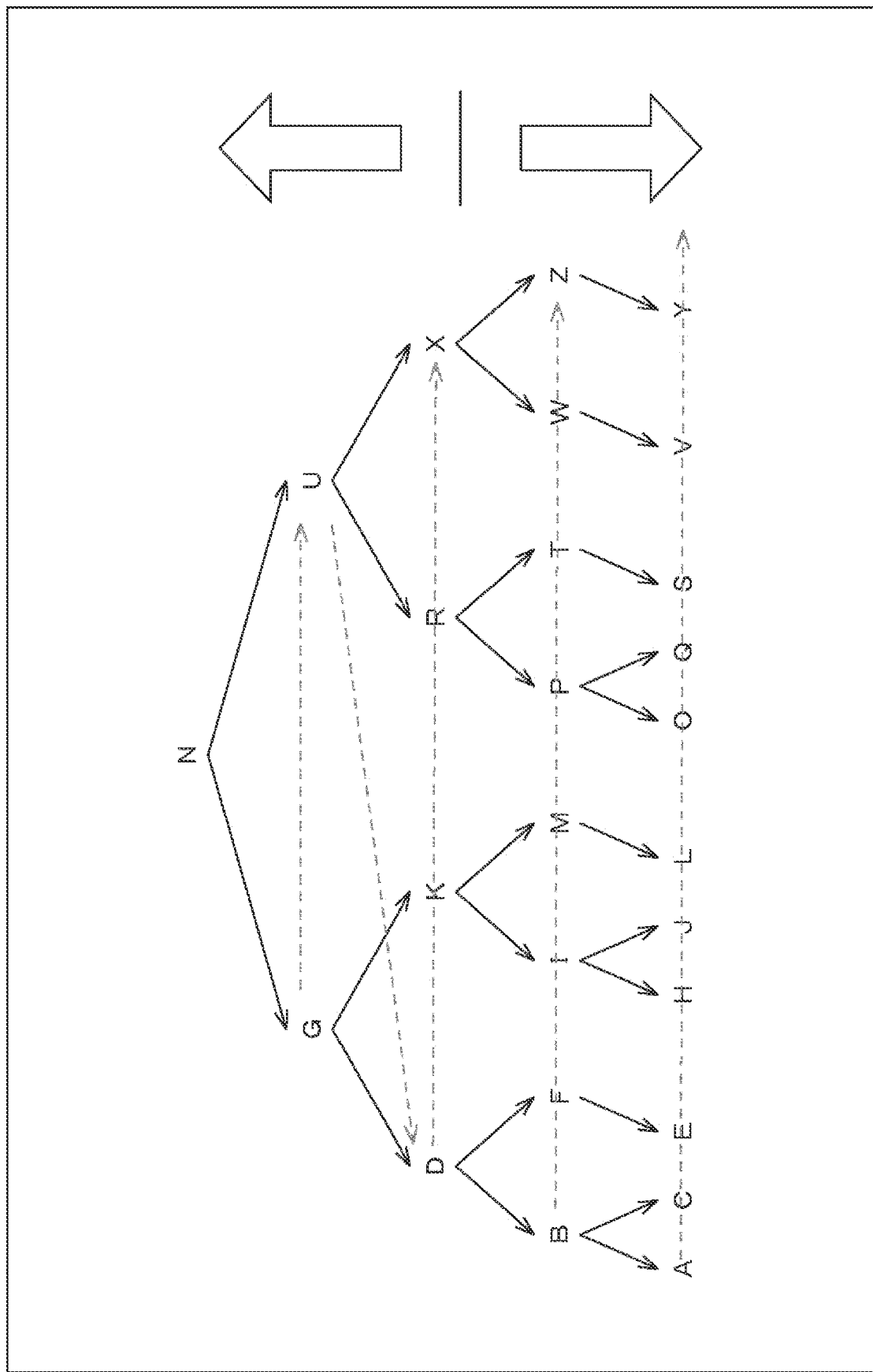
FIG. 17 is a diagram for explaining an example of processing in the search order of a type 4.

For example, as shown in FIG. 17, type 0 and any one of the types 1 to 3 may be used in combination. That is, for some of the layers of an octree, the context is initialized for each layer, and encoding is performed. For the other layers, each node may be encoded, the context being a result of processing of the node processed immediately before the current node.

In the case of the example shown in FIG. 17, for each LoD from the highest layer to the layer of the nodes D to X, the type 0, which is a method of encoding each node using a result of processing of the node immediately before the current node, is used. Meanwhile, for each LoD from the layer of the nodes B to Z to the lowest layer, the type 1, which is a method of encoding the respective layers of an octree independently of one another, is used.

Since the type 0 has a higher coding efficiency than the type 1, a decrease in the coding efficiency in the upper layers can be prevented in this manner, and the encoded data of the octree can be decoded in a wider variety of processing orders in the decoding of the lower layers. For example, the decoder performs decoding on layers in the depth-first order, and this, can prevent an increase in memory usage more effectively than in a case where all the layers are decoded in the breadth-first order.

Note that any combination may be adopted. For example, the above example is not necessarily adopted, but types may be switched in a desired layer. Also, the type 1 may be used in the upper layers, and the type 0 may be used in the lower layers. With this arrangement, a decrease in the coding efficiency in the lower layers can be prevented, and the encoded data of the octree can be decoded in a wider variety of processing orders in the decoding of the upper layers, as opposed to the above example.

The frequency of decoding is normally higher in the upper-layer nodes than in the lower-layer nodes. Accordingly, the type 1 is used the upper layers, and the type 0 is used the lower layers, for example, so that a wider variety of decoding orders can be set for the upper layers with higher decoding frequencies, and a decrease in the coding efficiency in the lower layers with lower decoding frequencies can be prevented.

Further, since the number of nodes in an upper layer is smaller in an octree, the memory usage is smaller in an upper layer than in a lower layer. Therefore, the influence of the decoding order on the memory usage is smaller in an upper layer, for example. Accordingly, the type 0 is used in the upper layers, and the type 1 is used in the lower layers, so that a wider variety of decoding orders can be set for the lower layers in which the influence of the decoding order on the memory usage is relatively large, and a decrease in the coding efficiency in the upper layers in which the influence is relatively small can be prevented.

Also, in the above description, a combination of the type 0 and the type 1 has been explained. However, the type 2 or the type 3 can also be combined with the type 0 as in the above case of the type 1. In other words, the types 1 to 3 can only be used in some LoDs.

Figure 18:
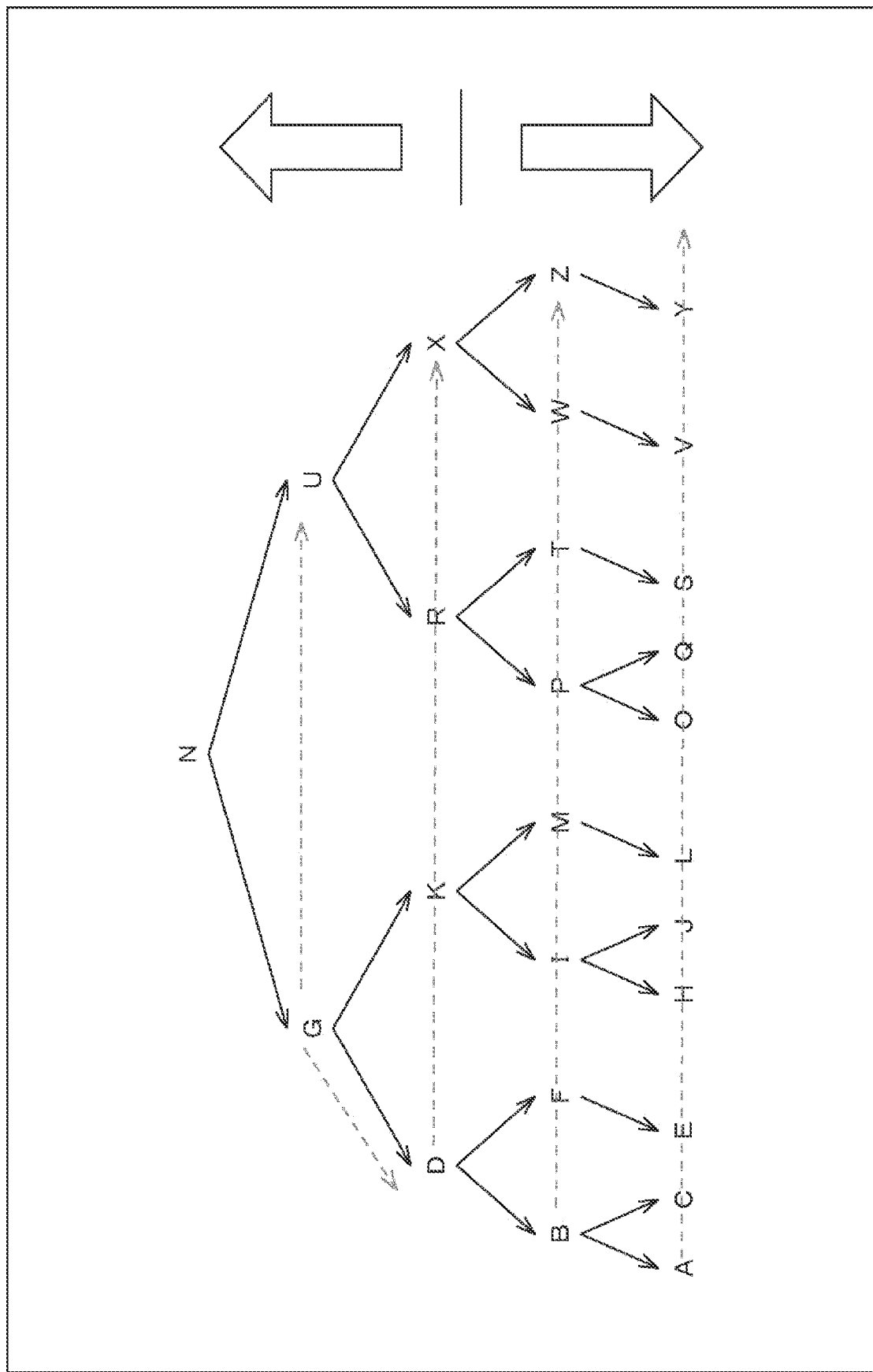
FIG. 18 is a diagram for explaining an example of processing in the search order of the type 4.

Further, as shown in FIG. 18, for example, some of the types 1 to 3 may be used in combination. That is, it is possible to encode an octree, using at least two of the following methods: a method of encoding a processing target layer independently of the other layers; a method of encoding the first node of the processing target layer, using the probability table of the first node of the layer one level higher; and a method of encoding the first node of the processing target layer, using the probability table of a predetermined node of the previous frame.

In the case of the example shown in FIG. 18, for each LoD from the highest layer to the layer of the nodes D to X, the type 2, which is a method of encoding the first node of the processing target layer with the probability table of the first node of the layer one level higher, is used. Meanwhile, for each LoD from the layer of the nodes B to Z to the lowest layer, the type 1, which is a method of encoding the processing target layer independently of the other layers, is used.

Since the type 2 has a higher coding efficiency than the type 1, a decrease in the coding efficiency in the upper layers can be prevented in this manner more effectively than in a case where the type 1 is used in all the layers. Also, since the type 1 can encode the respective LoDs independently of one another more effectively than the type 2, encoding of the lower layers can be performed in this manner at a higher speed than in a case where the type 2 is used in all the layers.

Note that any combination may be adopted. For example, the above example is not necessarily adopted, but types may be switched in a desired layer. Also, the type 2 may be used in the upper layers, and the type 1 may be used in the lower layers. Also, a combination other than the above combination of the type 1 and the type 2 may be used. For example, a combination of the type 2 and the type 3, a combination of the type 1 and the type 3, or the like may be used. Further, three or more types may be combined. Also, the same type may be used a plurality of times in combination with another type. For example, the type 0, the type 1, and the type 0 may be used in this order from the highest layer. It is of course possible to further combine the type 0 with these types of combinations. For example, all of the type 0, the type 1, the type 2, and the type 3 may be combined. In any case, the effects depending on the features of the respective types can be achieved as in the case of the above example combination of the type 1 and the type 2. In other words, the types 1 to 4 can only be used in some LoDs.

Which example combination should to be used depends on use cases. For example, the allocation of the processing amount and the resource usage to each LoD may be determined depending on the data use frequency.

Note that, in the case of the type 1, each LoD is encoded independently. That is, in this case, each LoD is turned into a slice. Such slicing is not necessarily performed for each LoD. That is, slicing (eliminating the encoding dependency relationship) may be performed at a position other than the first node (or the last node) of each LoD. That is, the arithmetic encoding may be reset at a node other than the first node of each LoD.

For example, a plurality of LoDs may be turned into one slice. For example, the type 0 and the type 1 are combined as described above, so that such a slice containing a plurality of LoDs can be formed.

Also, slicing may be performed at a node in the middle of an LoD, for example. For example, the type 1 is applied to the type 0 in the middle of a slice, so that such slicing can be performed. That is, the above plurality of types of combinations is not necessarily based on LoDs, but types may be combined at a node in the middle of an LoD.

As described above, any appropriate slicing method (any appropriate slice configuration) may be adopted. For example, the encoder may form each slice so that the processing amounts for the respective slices become more uniform. For example, the encoder may form each slice so that the numbers of nodes in the respective slices become more uniform. As the processing amounts for the respective slices are made more uniform in this manner, the load can be more evenly distributed in a case where the encoder or the decoder processes the respective slices in parallel.

Alternatively, the encoder may form each slice so that the amounts of resource usage (memory usage, for example) at the time of decoding the respective slices become more uniform, for example. Also, the encoder may form each slice so that the code amounts (bitstream sizes) of the respective slices become more uniform, for example.

<Selection of Type>

Further, a plurality of types including at least one of the above types 0 to 4 may be selected as candidates, and the encoder may select a desired type from the plurality of candidates and use that type for encoding. For example, the encoder may select at least one method from a plurality of candidates including at least one of the following methods: a method of encoding the respective layers of an octree independently of one another; a method of encoding the first node of each layer of an octree, using the probability table of the first node of the layer one level higher; and a method of encoding the first node of each layer of an octree, using the probability table of a predetermined node of the previous frame. The encoder may then encode an octree, using the selected method.

For example, the encoder may receive a type designation (an encoding parameter) from the outside such as a user, select a type from a plurality of candidates on the basis of the designation, and use the selected method for encoding. By doing so, the encoder can encode an octree in a wider variety of methods. Thus, the encoder can encode an octree by a method compatible with decoders of a wider variety of specifications.

<Signal of Type Information>

Note that the information regarding the type of encoding described above may be transmitted to the decoder side. For example, the encoder may generate a bitstream containing the information indicating the type of encoding selected from a plurality of candidates as described above, and the octree encoded data generated by the encoding. For example, the encoder may transmit (signal) the information regarding the type of encoding as the header information in the bitstream. For example, as shown in FIG. 19, the information regarding the type of encoding may be transmitted (signaled) in a frame header (Frame Header) that is the header information about each frame, or an LoD header (LoD Header) that is the header information about each LoD, the header information being included in the bitstream.

In the case of the example shown in FIG. 19, information such as the type (Type), the number of slices (SliceNum), and the offset (Offset) is signaled in a frame header. The type (Type) is identification information indicating the type of encoding applied to the frame. For example, in a case where the types 0 to 4 can be applied as described above, one of "0" to "4" is set. The value of this type (Type) is of course any appropriate value. By referring to this type (Type), the decoder can more easily identify the type of encoding applied to the frame. Thus, an appropriate decoding method (decoding order) for the bitstream can be selected more easily.

The number of slices (SliceNum) is information indicating the number of slices contained in the frame. For example, in a case where the type 1 is applied, the arithmetic encoding is reset at a node in the middle, and a slice is formed. A value indicating the number of slices formed in this manner is set in the number of slices (SliceNum). By referring to this number of slices (SliceNum), the decoder can recognize the number of slices more easily, and thus, can parallelize the decoding of the respective slices more easily and more appropriately. Note that the number of slices (SliceNum) may be signaled only in a case where a plurality of slices is formed, or where encoding of the type 1 is performed (a case where Type=1 or 4), but may be skipped in the other cases.

The offset (Offset) is information indicating the position of the data of each slice contained in the frame in the bitstream of the frame. For example, a value indicating the beginning address of the data of each slice included in the frame is set in the offset (Offset). By referring to this offset (Offset), the decoder can more easily access the encoded data (the bitstream) of a desired slice. Note that this offset (Offset) may be signaled only in a case where a plurality of slices is formed, or where encoding of the type 1 is performed (a case where Type=1 or 4), but may be skipped in the other cases.

Also, in the case of the example shown in FIG. 19, information such as the type (Type) and the size (Size) is signaled in an LoD header. The type (Type) is identification information indicating the type of encoding applied to the LoD. For example, in a case where the types 0 to 4 can be applied as described above, one of "0" to "4" is set. The value of this type (Type) is of course any appropriate value. By referring to this type (Type), the decoder can more easily identify the type of encoding applied to the LoD. Thus, an appropriate decoding method (decoding order) for the bitstream of the LoD can be selected more easily. Note that this type (Type) may be signaled only in a case where the type of encoding varies with LoDs, or where Type=4 in the frame header, but may be skipped in the other cases.

The size (Size) is information indicating the size (code amount) of the encoded data (bitstream) of the LoD. By referring to this information, the decoder can more easily extract the encoded data of the LoD from the bitstream.

The above information may of course be signaled in header information other than the examples described above. Also, the above information can be stored at any appropriate position in the bitstream. Further, the above information may be transmitted (signaled) as data different from the bitstream of the octree (the information being associated with the bitstream of the octree, for example) to the decoder side.

<Other Aspects>

Note that, in the examples described above, arithmetic encoding using a context (context-based adaptive binary arithmetic coding (CABAC), for example) has been described as an encoding method for octree data. However, the encoding method for octree data is only required to be lossless encoding using a context (entropy coding), and is not necessarily the arithmetic encoding described above. For example, the encoding method may be a non-binary encoding method. Also, the encoding method may be an encoding method using a plurality of contexts.

2. First Embodiment

<Encoding Device>

Figure 20:
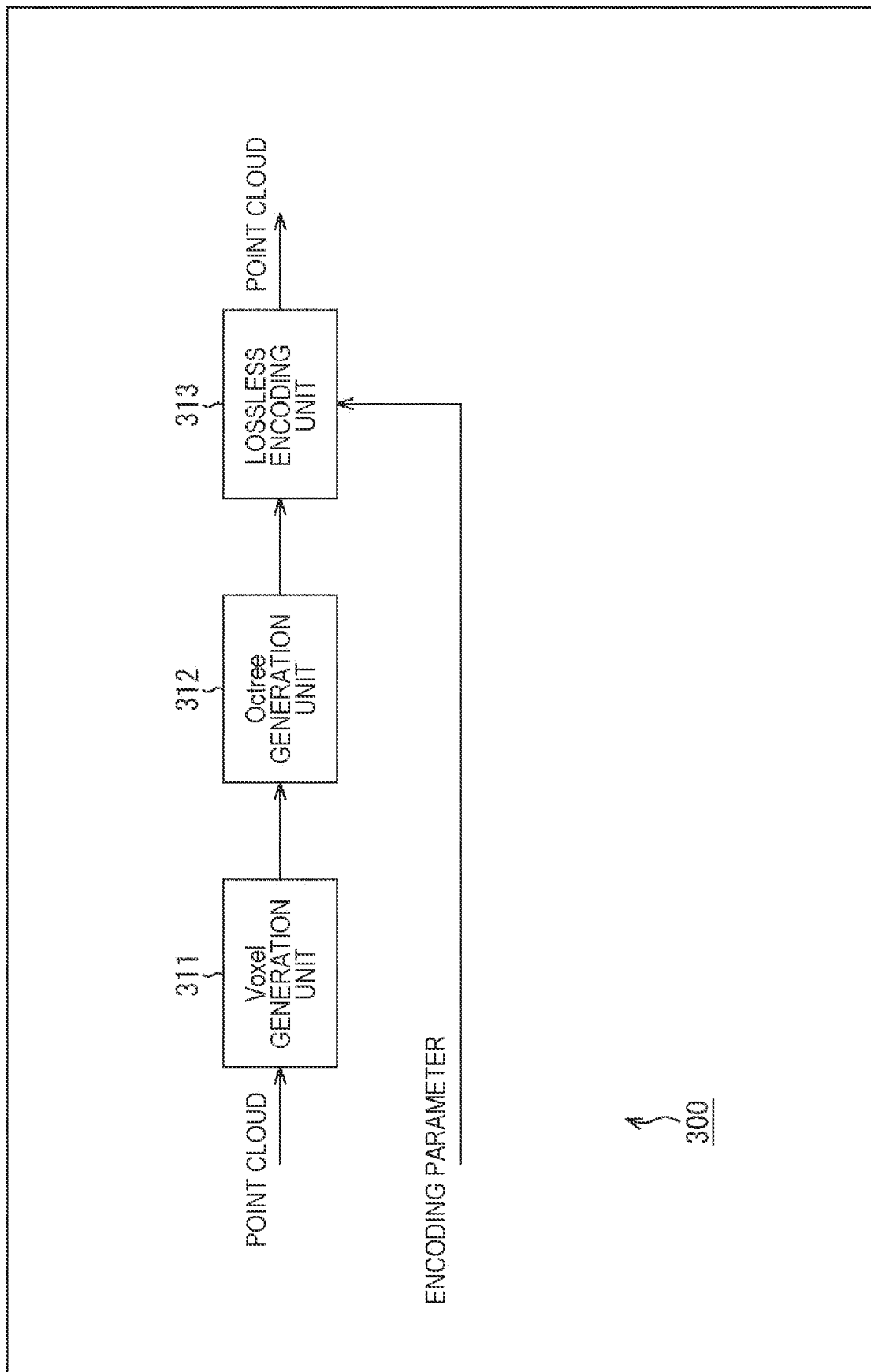
FIG. 20 is a block diagram showing a typical example configuration of an encoding device.

Next, a configuration that realizes the encoding as described is described. FIG. 20 is a block diagram showing an example configuration of an encoding device as an embodiment of an image processing apparatus to which the present technology is applied. An encoding device 300 shown in FIG. 20 is a device that encodes 3D data such as a point cloud, using voxels and an octree.

Note that FIG. 20 shows the principal ones of the processing units, the data flows, and the like, and does not necessarily show all of them. That is, in the encoding device 300, there may be a processing unit that is not shown as a block in FIG. 20, or there may be a processing or data flow that is not shown as an arrow or the like in FIG. 20. This also applies to the other drawings for explaining the processing units and the like in the encoding device 300.

As shown in FIG. 20, the encoding device 300 includes a voxel generation unit 311, an octree generation unit 312, and a lossless encoding unit 313.

The voxel generation unit 311 performs a process relating to generation of voxels. For example, the voxel generation unit 311 acquires point cloud data that is input to the encoding device 300. Further, the voxel generation unit 311 also sets a bounding box for a region including the acquired point cloud data. The voxel generation unit 311 further divides the bounding box, and sets voxels, to quantize positional information about the point cloud data. The voxel generation unit 311 supplies the voxel data generated in this manner to the octree generation unit 312.

The octree generation unit 312 performs a process related to octree generation. For example, the octree generation unit 312 acquires the voxel data supplied from the voxel generation unit 311. Further, the octree generation unit 312 also generates an octree from the voxel data. The octree generation unit 312 supplies the generated octree data to the lossless encoding unit 313.

The lossless encoding unit 313 performs a process related to lossless encoding of octree data. For example, the lossless encoding unit 313 acquires the octree data supplied from the octree generation unit 312. Further, the lossless encoding unit 313 also acquires an encoding parameter that is input from the outside of the encoding device 300. This encoding parameter is information that specifies the type of coding to be applied, and is input by a user operation or is supplied from an external device or the like, for example. The lossless encoding unit 313 encodes the octree data with the type specified by this encoding parameter, and generates encoded data of the octree. The lossless encoding unit 313 generates a bitstream containing the encoded data of the octree, and outputs the bitstream to the outside of the encoding device 300 (transmits the bitstream to the decoding side).

Note that these processing units (the voxel generation unit 311, the octree generation unit 312, and the lossless encoding unit 313) have any appropriate configurations. For example, each processing unit may be formed with a logic circuit that achieves the processes described above. Alternatively, each processing unit may include a central processing unit (CPU), a read only memory (ROM), a random access memory (RAM), and the like, for example, and execute a program using these components, to perform the processes described above. Each processing unit may of course have both configurations, and perform some of the processes described above with a logic circuit, and the other by executing a program. The configurations of the respective processing units may be independent of one another. For example, one processing unit may perform some of the processes described above with a logic circuit while the other processing units perform the processes described above by executing a program. Further, some other processing unit may perform the processes described above both with a logic circuit and by executing a program.

As described above, the lossless encoding unit 313 is compatible with a plurality of types of encoding, and can encode an octree by a wider variety of methods accordingly. Particularly, the lossless encoding unit 313 is compatible with a type by which encoding is performed by initializing the context for each layer of an octree. Accordingly, the lossless encoding unit 313 (which is the encoding device 300) can perform encoding so that the decoder can decode the encoded data of an octree in a wider variety of processing orders. In addition to that, as the lossless encoding unit 313 (which is the encoding device 300) performs such a type of encoding, the decoder can select a more appropriate processing order, and decode the encoded data of an octree in the more appropriate processing order.

<Lossless Encoding Unit>

Figure 21:
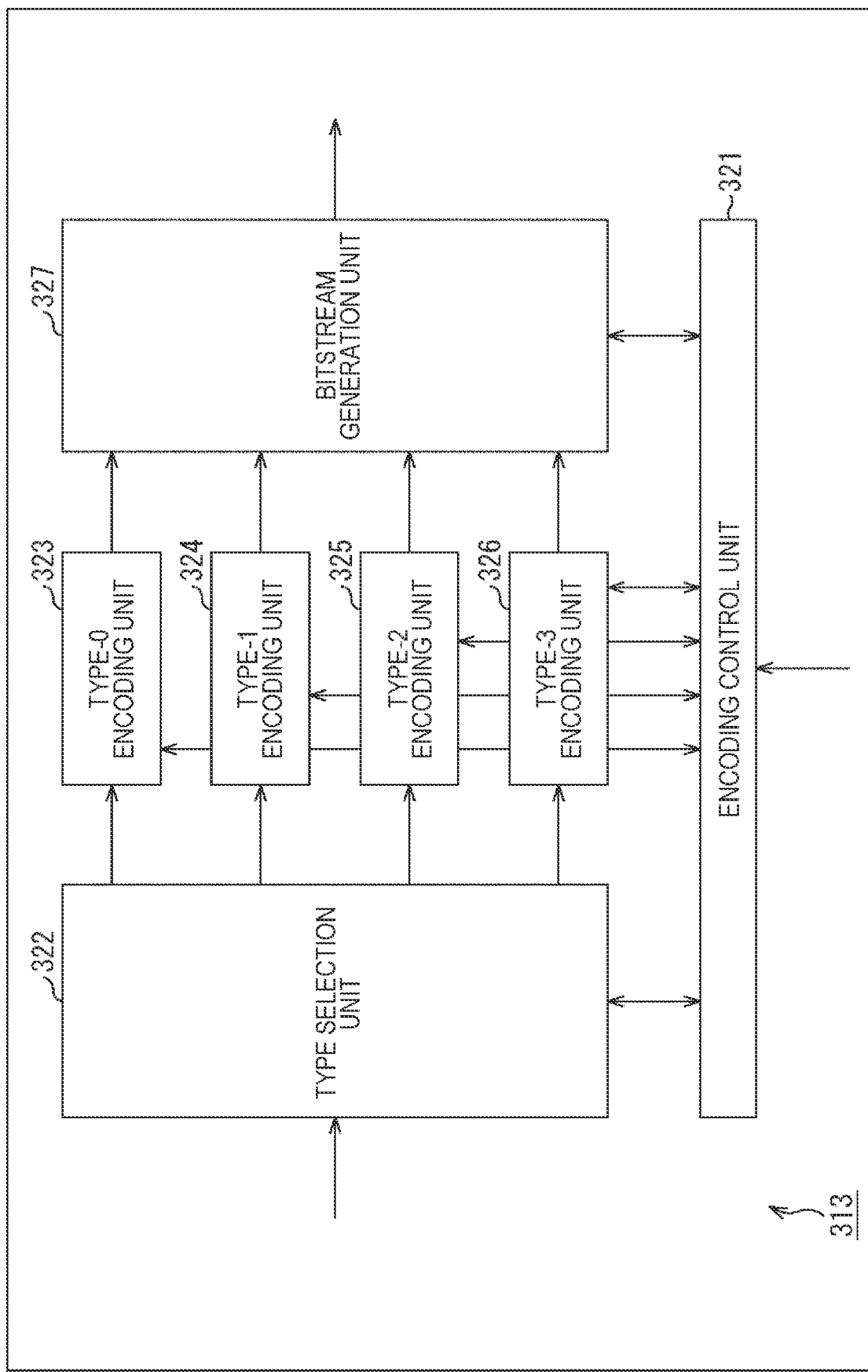
FIG. 21 is a block diagram showing a typical example configuration of a lossless encoding unit.

FIG. 21 is a block diagram showing a typical example configuration of the lossless encoding unit 313. In the case of this example, the lossless encoding unit 313 prepares a plurality of types of encoding including a type for performing encoding by initializing the context for each octree layer as candidates, selects the type of encoding designed by an encoding parameter from the plurality of candidates, and encodes an octree by the selected type.

As shown in FIG. 21, the lossless encoding unit 313 includes an encoding control unit 321, a type selection unit 322, a type-0 encoding unit 323, a type-1 encoding unit 324, a type-2 encoding unit 325, a type-3 encoding unit 326, and a bitstream generation unit 327.

The encoding control unit 321 performs a process related to encoding control. For example, the encoding control unit 321 acquires an encoding parameter supplied from the outside of the encoding device 300. Further, the encoding control unit 321 also notifies the type selection unit 322 of the type designated by the encoding parameter. Further, the encoding control unit 321 also controls the processing unit compatible with the type designated by the encoding parameter among the processing units from the type-0 encoding unit 323 to the type-3 encoding unit 326, so that encoding of that type is performed. Further, the encoding control unit 321 further generates a frame header and an LoD header including information as described above with reference to FIG. 19, and supplies the frame header and the LoD header to the bitstream generation unit 327.

The type selection unit 322 performs a process related to selection of a type of encoding. For example, the type selection unit 322 acquires octree data supplied from the octree generation unit 312. Further, under the control of the encoding control unit 321, the type selection unit 322 also supplies the octree data to the processing unit compatible with the applied type of encoding among the processes units from the type-0 encoding unit 323 to the type-3 encoding unit 326 (or switches the octree data supply destination). For example, the type selection unit 322 can select the type of encoding to be applied for each LoD of the octree data (or switch the octree data supply destination for each LoD).

The type-0 encoding unit 323 performs a process related to type-0 encoding as described above with reference to FIGS. 4, 5, and others in <Breadth-First Order> in <1. Octree Encoding and Decoding Orders>, for example. For example, the type-0 encoding unit 323 acquires the octree data supplied from the type selection unit 322. The type-0 encoding unit 323 also performs type-0 encoding on the octree data, to generate encoded data. That is, the type-0 encoding unit 323 encodes the data of each node of the octree data in a breadth-first order. The type-0 encoding unit 323 supplies the encoded data generated by the type-0 encoding, to the bitstream generation unit 327. The type-0 encoding unit 323 performs these processes, under the control of the encoding control unit 321.

The type-1 encoding unit 324 performs a process related to type-1 encoding as described above with reference to FIGS. 9, 10, and others in <Type 1> in <1. Octree Encoding and Decoding Orders>, for example. For example, the type-1 encoding unit 324 acquires the octree data supplied from the type selection unit 322. Further, the type-1 encoding unit 324 also performs type-1 encoding on the octree data, to generate encoded data. That is, the type-1 encoding unit 324 encodes the respective octree layers independently of one another. The type-1 encoding unit 324 supplies the encoded data generated by the type-1 encoding, to the bitstream generation unit 327. The type-1 encoding unit 324 performs these processes, under the control of the encoding control unit 321.

The type-2 encoding unit 325 performs a process related to type-2 encoding as described above with reference to FIGS. 11, 12, and others in <Type 2> in <1. Octree Encoding and Decoding Orders>, for example. For example, the type-2 encoding unit 325 acquires the octree data supplied from the type selection unit 322. Further, the type-2 encoding unit 325 also performs type-2 encoding on the octree data, to generate encoded data. That is, the type-2 encoding unit 325 encodes the first node of each LoD of the octree, using the probability table of its parent node. The type-2 encoding unit 325 supplies the encoded data generated by the type-2 encoding, to the bitstream generation unit 327. The type-2 encoding unit 325 performs these processes, under the control of the encoding control unit 321.

The type-3 encoding unit 326 performs a process related to type-3 encoding as described above with reference to FIGS. 13, 14, and others in <Type 3> in <1. Octree Encoding and Decoding Orders>, for example. For example, the type-3 encoding unit 326 acquires the octree data supplied from the type selection unit 322. Further, the type-3 encoding unit 326 also performs type-3 encoding on the octree data, to generate encoded data. That is, the type-3 encoding unit 326 encodes the first node of each LoD of the octree, using the probability table of a predetermined node of the previous frame. The type-3 encoding unit 326 supplies the encoded data generated by the type-3 encoding, to the bitstream generation unit 327. The type-3 encoding unit 326 performs these processes, under the control of the encoding control unit 321.

The bitstream generation unit 327 performs a process related to generation of a bitstream. For example, the bitstream generation unit 327 acquires the encoded data of the octree supplied from the encoding units of the type-0 encoding unit 323 to the type-3 encoding unit 326. Further, the bitstream generation unit 327 also acquires the header information (such as the frame header and the LoD header, for example) supplied from the encoding control unit 321. Further, the bitstream generation unit 327 further generates a bitstream containing the encoded data supplied from the encoding units of the type-0 encoding unit 323 to the type-3 encoding unit 326, and the header information supplied from the encoding control unit 321. Then, the bitstream generation unit 327 then outputs the generated bitstream to the outside of the encoding device 300.

Note that these processing units (the encoding control unit 321 to the bitstream generation unit 327) each have any appropriate configuration. For example, each processing unit may be formed with a logic circuit that achieves the processes described above. Alternatively, each processing unit may include a central processing unit (CPU), a read only memory (ROM), a random access memory (RAM), and the like, for example, and execute a program using these components, to perform the processes described above. Each processing unit may of course have both configurations, and perform some of the processes described above with a logic circuit, and the other by executing a program. The configurations of the respective processing units may be independent of one another. For example, one processing unit may perform some of the processes described above with a logic circuit while the other processing units perform the processes described above by executing a program. Further, some other processing unit may perform the processes described above both with a logic circuit and by executing a program.

Note that, as the type of encoding to be applied is switched in the middle of an octree, the lossless encoding unit 313 can adopt the type 4. The encoding control unit 321 switches the type of encoding.

As described above, the lossless encoding unit 313 can perform encoding of the types 0 to 4. Accordingly, the lossless encoding unit 313 (the encoding device 300) can achieve the effects of the respective types as described above in <1. Octree Encoding and Decoding Orders>. Thus, the decoder can select a more appropriate processing order, and decode the encoded data of the octree in the more appropriate processing order.

Note that, in the above description, the lossless encoding unit 313 includes the encoding units of the type-0 encoding unit 323 to the type-3 encoding unit 326. That is, the encoding device 300 described above can perform the four types of encoding of the types 0 to 3 (the type 4 is not included herein). However, the encoding device 300 may be capable of performing encoding of any appropriate type. For example, the encoding device 300 may be capable of performing encoding of a type other than the examples described above.

Further, the number of types with which the encoding device 300 is compatible is any appropriate number, and is not limited to the above example. In other words, the encoding device 300 may be capable of performing three or less types of encoding, or may be capable of performing five or more types of encoding, for example.

In either case, the lossless encoding unit 313 is only required to include, in parallel, encoding units of types the encoding device 300 can perform, like the encoding units of the type-0 encoding unit 323 to the type-3 encoding unit 326. That is, in the example illustrated in FIG. 21, the lossless encoding unit 313 includes the four encoding units of the type-0 encoding unit 323 to the type-3 encoding unit 326. However, the lossless encoding unit 313 is not limited to this example, and may include three or less encoding units, or five or more encoding units.

<Flow in an Encoding Process>

Figure 22:
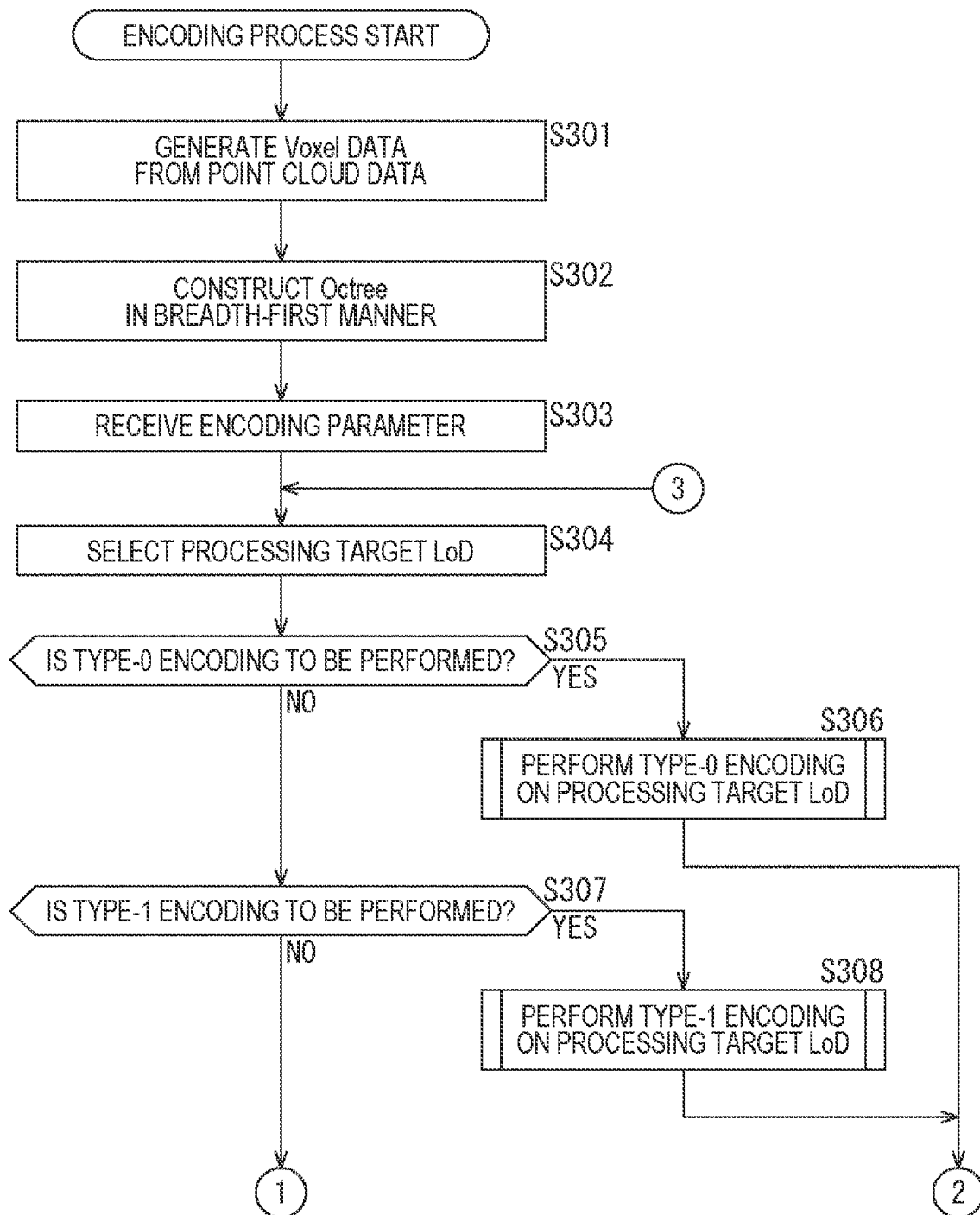
FIG. 22 is a flowchart for explaining an example flow in an encoding process.
Figure 23:
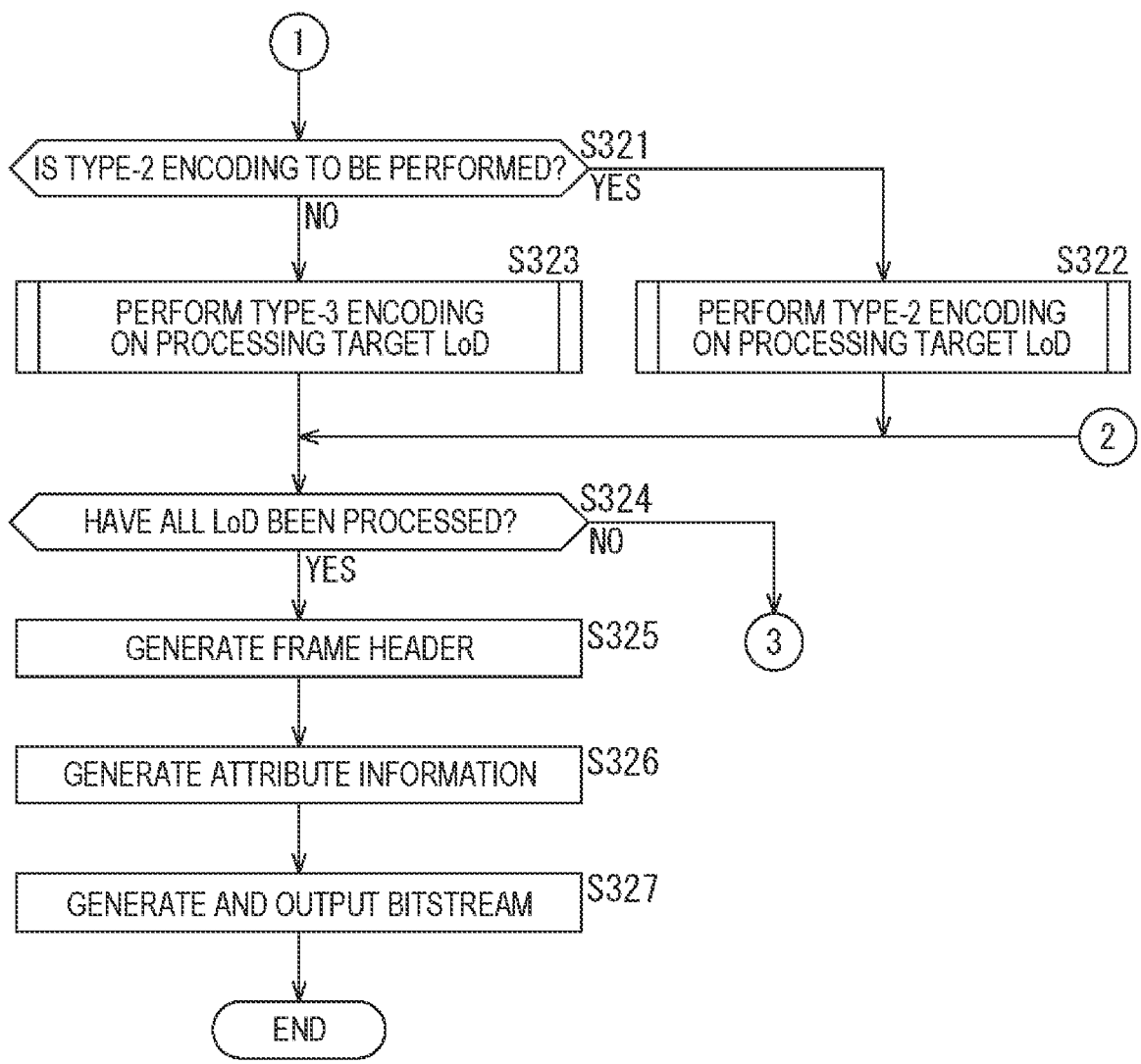
FIG. 23 is a flowchart continuing from FIG. 22, for explaining an example flow in an encoding process.

Next, an example flow in an encoding process to be performed by the encoding device 300 is described, with reference to the flowchart shown in FIGS. 22 and 23.

When the encoding process is started, the voxel generation unit 311 of the encoding device 300 in step S301 generates voxel data from point cloud data input to the encoding device 300.

In step S302, the octree generation unit 312 constructs an octree from the voxel data generated in step S301, searches the octree in breadth-first order, and generates octree data.

In step S303, the encoding control unit 321 of the lossless encoding unit 313 receives an encoding parameter input from the outside of the encoding device 300.

In step S304, the lossless encoding unit 313 selects one processing target LoD from the octree constructed in step S302. The encoding control unit 321 of the lossless encoding unit 313 selects a processing target LoD in each one layer in order from the highest layer to the lowest layer. That is, under the control of the encoding control unit 321, the type selection unit 322 of the lossless encoding unit 313 reads the octree data from the octree generation unit 312 for each one LoD from the top, and sets the LoD as the processing target.

In step S305, the encoding control unit 321 of the lossless encoding unit 313 determines whether or not to encode the data of the processing target LoD by the type 0, on the basis of the encoding parameter acquired in step S303. If it is determined that encoding is to be performed by the type 0, the type selection unit 322 supplies the data of the processing target LoD to the type-0 encoding unit 323. Then, the process then moves on to step S306.

In step S306, the lossless encoding unit 313 performs a type-0 encoding process, to encode the data of the processing target LoD by the type 0. This type-0 encoding process will be described later in detail.

When the type-0 encoding process is completed, the process moves on to step S324 in FIG. 23. Further, if it is determined in step S305 in FIG. 22 that encoding is not to be performed by the type 0, on the other hand, the process moves on to step S307.

In step S307, the encoding control unit 321 of the lossless encoding unit 313 determines whether or not to encode the data of the processing target LoD by the type 1, on the basis of the encoding parameter acquired in step S303. If it is determined that encoding is to be performed by the type 1, the type selection unit 322 supplies the data of the processing target LoD to the type-1 encoding unit 324. Then, the process then moves on to step S308.

In step S308, the lossless encoding unit 313 performs a type-1 encoding process, to encode the data of the processing target LoD by the type 1. This type-1 encoding process will be described later in detail.

When the type-1 encoding process is completed, the process moves on to step S324 in FIG. 23. Further, if it is determined in step S307 in FIG. 22 that encoding is not to be performed by the type 1, on the other hand, the process moves on to step S321 in FIG. 23.

In step S321 in FIG. 23, the encoding control unit 321 of the lossless encoding unit 313 determines whether or not to encode the data of the processing target LoD by the type 2, on the basis of the encoding parameter acquired in step S303. If it is determined that encoding is to be performed by the type 2, the type selection unit 322 supplies the data of the processing target LoD to the type-2 encoding unit 325. Then, the process then moves on to step S322.

In step S322, the lossless encoding unit 313 performs a type-2 encoding process, to encode the data of the processing target LoD by the type 2. This type-2 encoding process will be described later in detail.

When the type-2 encoding process is completed, the process moves on to step S324. Further, if it is determined in step S321 that encoding is not to be performed by the type 2, on the other hand, the type selection unit 322 supplies the data of the processing target LoD to the type-3 encoding unit 326. Then, the process then moves on to step S323.

In step S323, the lossless encoding unit 313 performs a type-3 encoding process, to encode the data of the processing target LoD by the type 3. This type-3 encoding process will be described later in detail. When the type-3 encoding process is completed, the process moves on to step S324.

In step S324, the encoding control unit 321 of the lossless encoding unit 313 determines whether or not all the LoDs have been processed. If it is determined that there is an unprocessed LoD, the process returns to step S304 in FIG. 22, and the processes in step S304 and the steps that follow are repeated. That is, a new LoD (an unprocessed LoD) is selected as the processing target in step S304, and the respective processes in steps S305 to S323 are performed on the processing target LoD as appropriate.

As described above, the processes in steps S304 to S324 are performed on each LoD as appropriate, and, if it is determined in step S324 that all the LoDs have been processed, the process moves on to step S325.

In step S325, the encoding control unit 321 of the lossless encoding unit 313 generates a frame header.

In step S326, the lossless encoding unit 313 (one of the encoding units of the type-0 encoding unit 323 to the type-3 encoding unit 326) generates and encodes attribute information corresponding to the Octree data described above.

In step S327, the bitstream generation unit 327 generates a bitstream containing the encoded data of the Octree data and the header information, and outputs the bitstream to the outside of the encoding device 300 (transmits the bitstream to the decoding side).

When the process in step S327 is completed, the encoding process comes to an end. The encoding device 300 performs such an encoding process on each frame, to generate a bitstream of the Octree data of each frame.

<Flow in the Type-0 Encoding Process>

Figure 24:
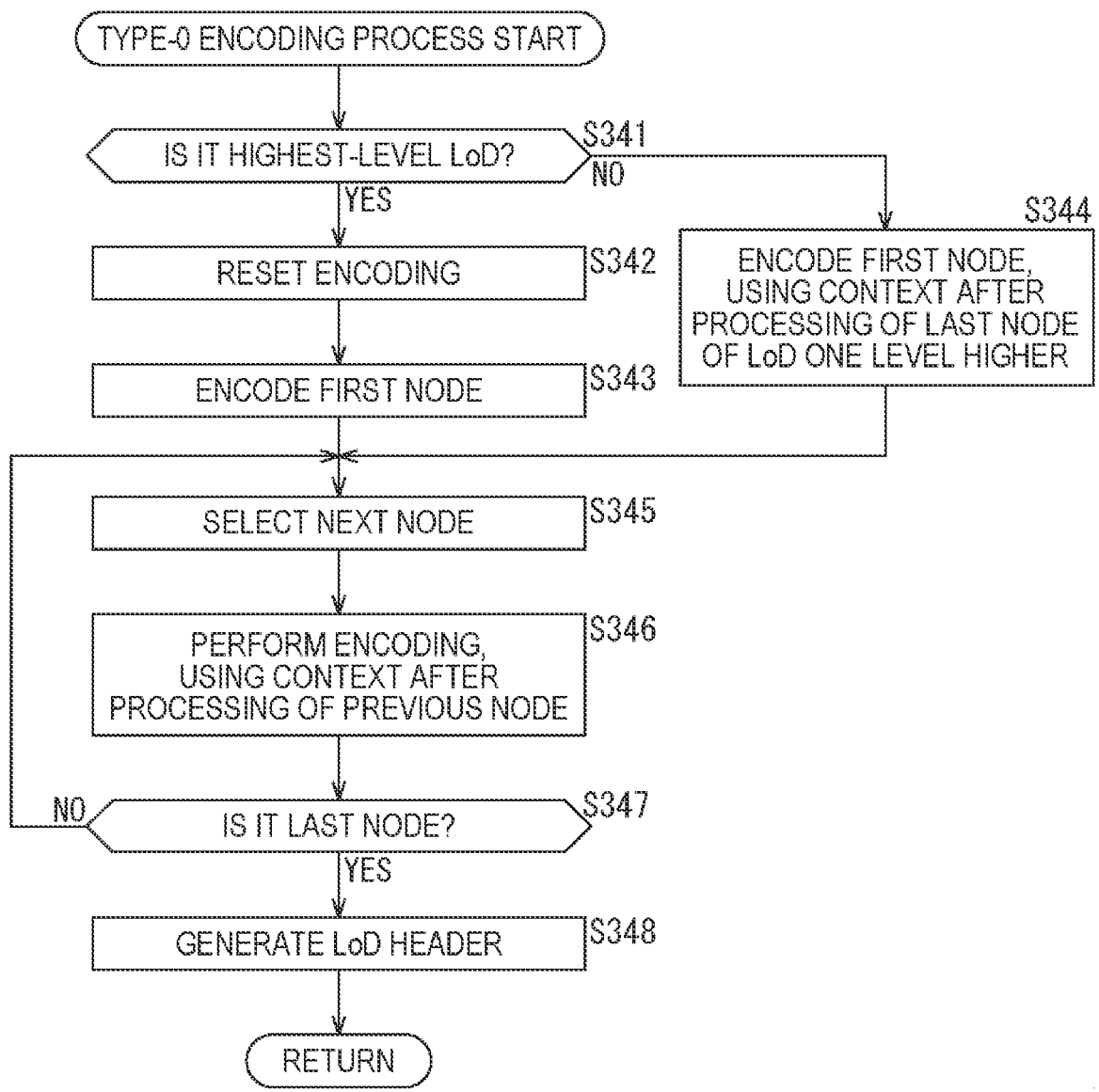
FIG. 24 is a flowchart for explaining an example flow in a type-0 encoding process.

Next, an example flow in the type-0 encoding process to be performed in step S306 in FIG. 22 is described, with reference to the flowchart shown in FIG. 24.

When the type-0 encoding process is started, the encoding control unit 321 determines in step S341 whether or not the processing target LoD is the highest-level LoD (the LoD of the highest layer). If the processing target LoD is determined to be the highest-level LoD, the process moves on to step S342.

In step S342, the type-0 encoding unit 323 resets (the context of) the arithmetic encoding.

In step S343, the type-0 encoding unit 323 encodes the first node of the processing target LoD.

When the process in step S343 is completed, the process moves on to step S345. Further, if the processing target LoD is determined not to be the highest-level LoD in step S341, on the other hand, the process moves on to step S344.

In step S344, the type-0 encoding unit 323 performs arithmetic encoding on the first node of the processing target LoD, using the processed context of the last node of the LoD one level higher. When the process in step S344 is completed, the process moves on to step S345.

In step S345, the type-0 encoding unit 323 selects the next node as the processing target.

In step S346, the type-0 encoding unit 323 performs arithmetic encoding on the processing target node, using the processed context of the previous node.

In step S347, the type-0 encoding unit 323 determines whether or not the processing target node is the last node of the processing target LoD. If it is determined that the processing target node is not the last node of the processing target LoD, or that there is an unprocessed node in the processing target LoD, the process returns to step S345.

If the respective processes in steps S345 to S347 have been performed on each node of the processing target LoD, and it is determined in step S347 that the processing target node is the last node of the processing target LoD, or that all the nodes of the processing target LoD have been processed, the process moves on to step S348. In step S348, the encoding control unit 321 generates the LoD header of the processing target LoD. The encoding control unit 321 supplies the generated LoD header to the bitstream generation unit 327.

When the process in step S348 is completed, the type-0 encoding process comes to an end, and the process returns to FIG. 22.

By performing the type-0 encoding process in the above manner, (the encoding control unit 321 and the type-0 encoding unit 323 of) the lossless encoding unit 313 can encode the processing target LoD by the type 0. Thus, the effects associated with the type-0 encoding described in <1. Signal of Camera Parameter for Rendering> can be achieved.

<Flow in the Type-1 Encoding Process>

Figure 25:
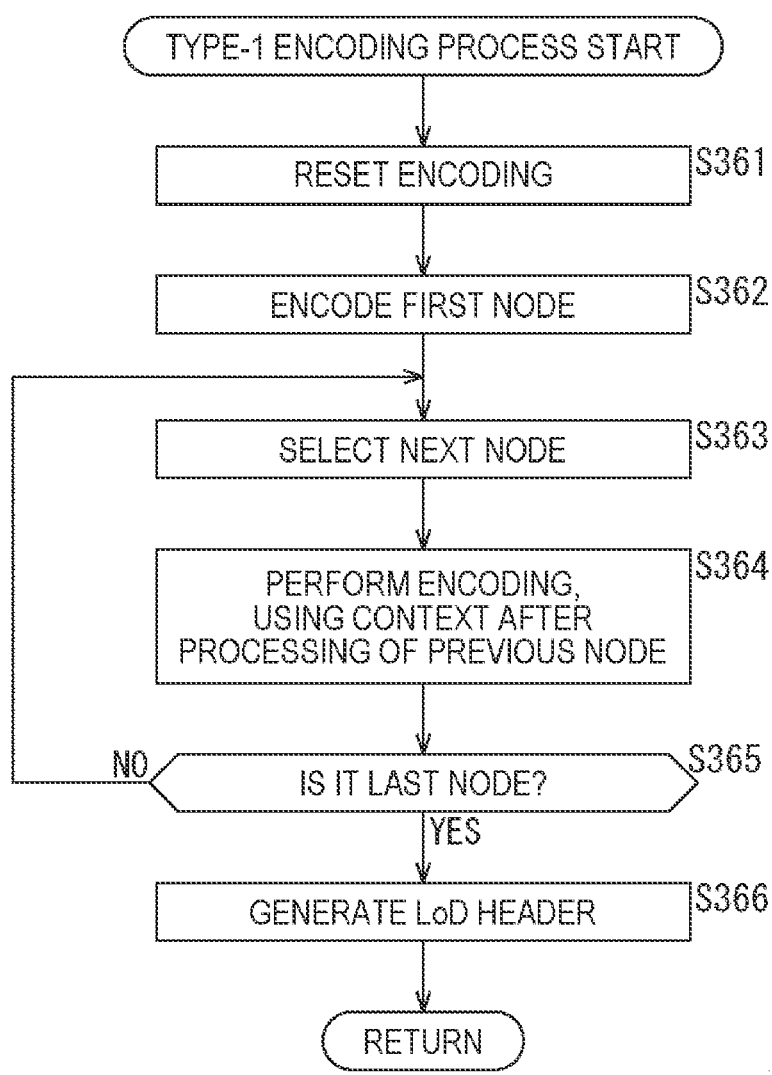
FIG. 25 is a flowchart for explaining an example flow in a type-1 encoding process.

Next, an example flow in the type-1 encoding process to be performed in step S308 in FIG. 22 is described, with reference to the flowchart shown in FIG. 25.

When the type-1 encoding process is started, the type-1 encoding unit 324 resets (the context of) the arithmetic encoding in step S361.

In step S362, the type-1 encoding unit 324 encodes the first node of the processing target LoD.

In step S363, the type-1 encoding unit 324 selects the next node as the processing target.

In step S364, the type-1 encoding unit 324 performs arithmetic encoding on the processing target node, using the processed context of the previous node.

In step S365, the type-1 encoding unit 324 determines whether or not the processing target node is the last node of the processing target LoD. If it is determined that the processing target node is not the last node of the processing target LoD, or that there is an unprocessed node in the processing target LoD, the process returns to step S363.

If the respective processes in steps S363 to S365 have been performed on each node of the processing target LoD, and it is determined in step S365 that the processing target node is the last node of the processing target LoD, or that all the nodes of the processing target LoD have been processed, the process moves on to step S366.

In step S366, the encoding control unit 321 generates the LoD header of the processing target LoD. The encoding control unit 321 supplies the generated LoD header to the bitstream generation unit 327.

When the process in step S366 is completed, the type-1 encoding process comes to an end, and the process returns to FIG. 22.

By performing the type-1 encoding process in the above manner, (the encoding control unit 321 and the type-1 encoding unit 324 of) the lossless encoding unit 313 can encode the processing target LoD by the type 1. Thus, the effects associated with the type-1 encoding described in <1. Signal of Camera Parameter for Rendering> can be achieved.

<Flow in the Type-2 Encoding Process>

Figure 26:
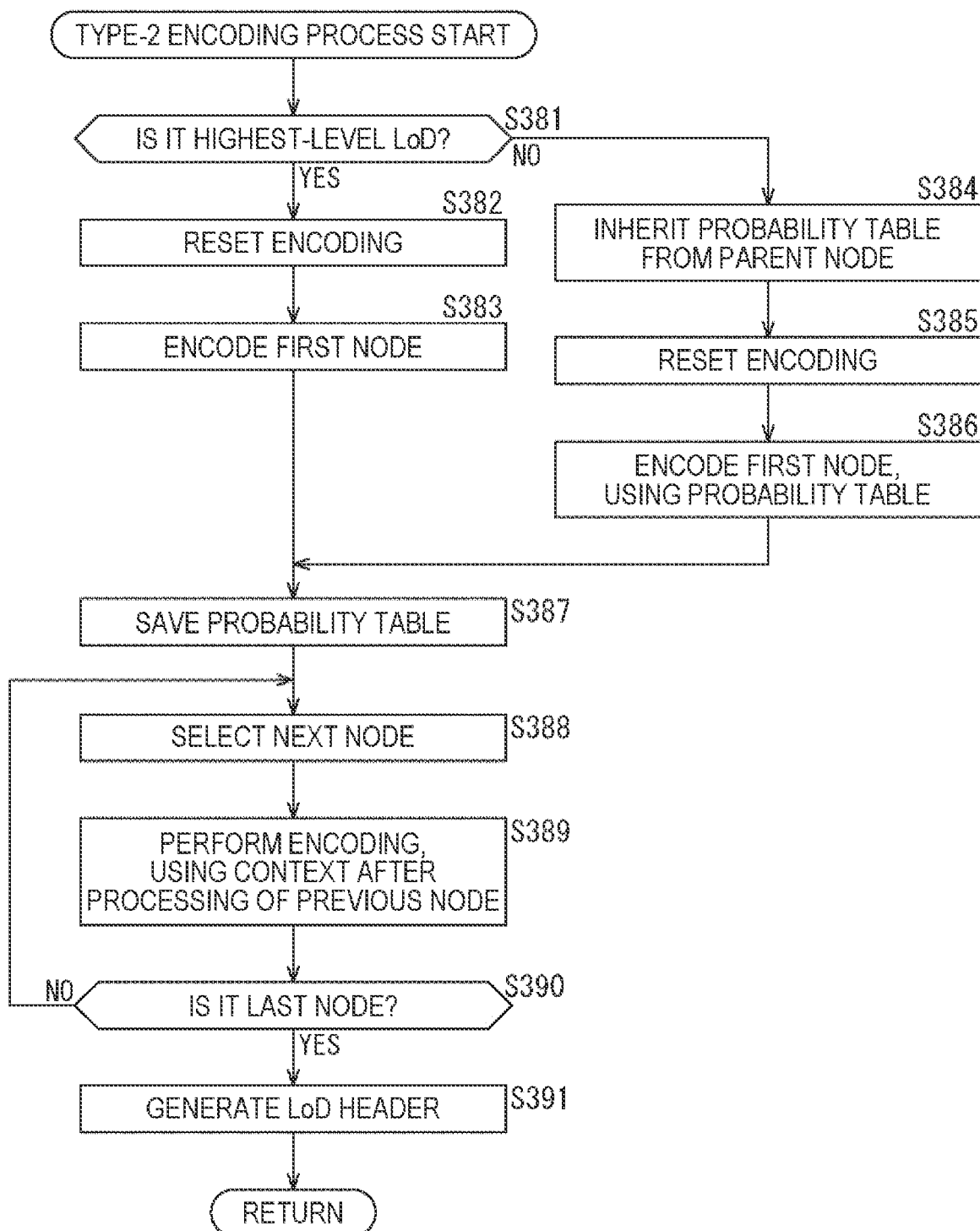
FIG. 26 is a flowchart for explaining an example flow in a type-2 encoding process.

Next, an example flow in the type-2 encoding process to be performed in step S322 in FIG. 23 is described, with reference to the flowchart shown in FIG. 26.

When the type-2 encoding process is started, the encoding control unit 321 determines in step S381 whether or not the processing target LoD is the highest-level LoD. If the processing target LoD is determined to be the highest-level LoD, the process moves on to step S382.

In step S382, the type-2 encoding unit 325 resets (the context of) the arithmetic encoding.

In step S383, the type-2 encoding unit 325 encodes the first node of the processing target LoD.

When the process in step S383 is completed, the process moves on to step S387. Further, if the processing target LoD is determined not to be the highest-level LoD in step S381, on the other hand, the process moves on to step S384.

In step S384, the type-2 encoding unit 325 inherits (makes a copy of) the probability table from the parent node of the first node of the processing target LoD, which is the processing target node.

In step S385, the type-2 encoding unit 325 resets (the context of) the arithmetic encoding.

In step S386, the type-2 encoding unit 325 encodes the first node of the processing target LoD, using the probability table inherited in step S384. When the process in step S386 is completed, the process moves on to step S387.

In step S387, the type-2 encoding unit 325 saves the probability table after the processing of the first node. This probability table is to be used in processing the first node of the LoD one level lower.

In step S388, the type-2 encoding unit 325 selects the next node as the processing target.

In step S389, the type-2 encoding unit 325 performs arithmetic encoding on the processing target node, using the processed context of the previous node.

In step S390, the type-2 encoding unit 325 determines whether or not the processing target node is the last node of the processing target LoD. If it is determined that the processing target node is not the last node of the processing target LoD, or that there is an unprocessed node in the processing target LoD, the process returns to step S388.

If the respective processes in steps S388 to S390 have been performed on each node of the processing target LoD, and it is determined in step S390 that the processing target node is the last node of the processing target LoD, or that all the nodes of the processing target LoD have been processed, the process moves on to step S391.

In step S391, the encoding control unit 321 generates the LoD header of the processing target LoD. The encoding control unit 321 supplies the generated LoD header to the bitstream generation unit 327.

When the process in step S391 is completed, the type-2 encoding process comes to an end, and the process returns to FIG. 23.

By performing the type-2 encoding process in the above manner, (the encoding control unit 321 and the type-2 encoding unit 325 of) the lossless encoding unit 313 can encode the processing target LoD by the type 2. Thus, the effects associated with the type-2 encoding described in <1. Signal of Camera Parameter for Rendering> can be achieved.

<Flow in the Type-3 Encoding Process>

Figure 27:
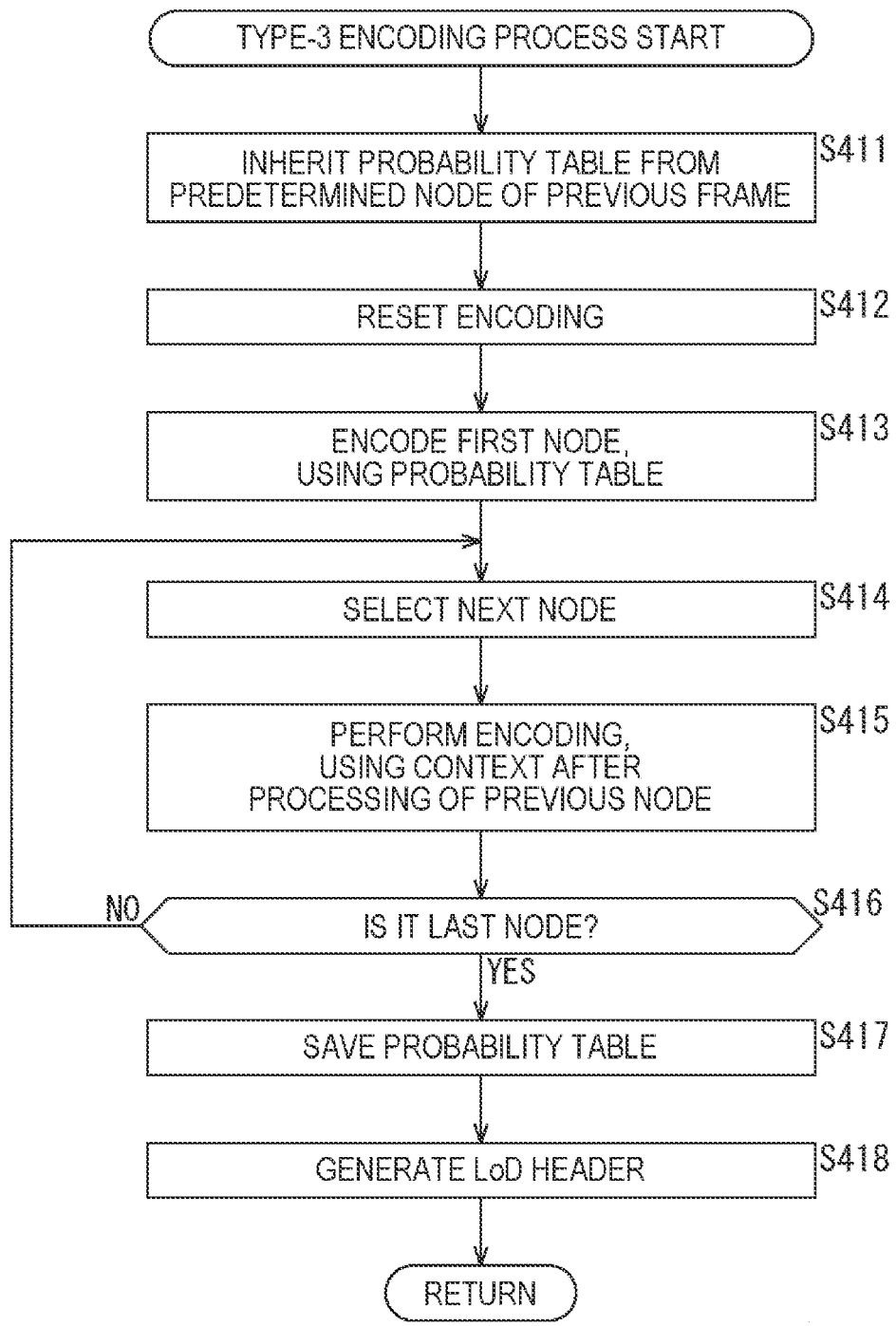
FIG. 27 is a flowchart for explaining an example flow in a type-3 encoding process.

Next, an example flow in the type-3 encoding process to be performed in step S323 in FIG. 23 is described, with reference to the flowchart shown in FIG. 27.

When the type-3 encoding process is started, the type-3 encoding unit 326 in step S411 inherits (makes a copy of) the probability table from a predetermined node of the frame (also referred to as the previous frame) processed immediately before the processing target frame.

In step S412, the type-3 encoding unit 326 resets (the context of) the arithmetic encoding.

In step S413, the type-3 encoding unit 326 encodes the first node of the processing target LoD, using the probability table inherited in step S411.

In step S414, the type-3 encoding unit 326 selects the next node as the processing target.

In step S415, the type-3 encoding unit 326 performs arithmetic encoding on the processing target node, using the processed context of the previous node.

In step S416, the type-3 encoding unit 326 determines whether or not the processing target node is the last node of the processing target LoD. If it is determined that the processing target node is not the last node of the processing target LoD, or that there is an unprocessed node in the processing target LoD, the process returns to step S414.

If the respective processes in steps S414 to S416 have been performed on each node of the processing target LoD, and it is determined in step S416 that the processing target node is the last node of the processing target LoD, or that all the nodes of the processing target LoD have been processed, the process moves on to step S417.

In step S417, the type-3 encoding unit 326 saves the probability table after encoding of the "predetermined node" of the processing target LoD. This "predetermined node" is a preset node whose probability table is to be referred to in encoding of the next frame. For example, as described above in <1. Signal of Camera Parameter for Rendering>, the last node of each LoD, the last node of the frame, or the like is set as the "predetermined node". Note that, in a case where such a "predetermined node" does not exist in the processing target LoD, the process in step S417 is skipped. The probability table saved in this manner is inherited (copied) in the processing of the next frame.

In step S418, the encoding control unit 321 generates the LoD header of the processing target LoD. The encoding control unit 321 supplies the generated LoD header to the bitstream generation unit 327.

When the process in step S418 is completed, the type-3 encoding process comes to an end, and the process returns to FIG. 23.

By performing the type-3 encoding process in the above manner, (the encoding control unit 321 and the type-3 encoding unit 326 of) the lossless encoding unit 313 can encode the processing target LoD by the type 3. Thus, the effects associated with the type-3 encoding described in <1. Signal of Camera Parameter for Rendering> can be achieved.

By performing each process as described above, the lossless encoding unit 313 can perform encoding of the types 0 to 4. Accordingly, the lossless encoding unit 313 (the encoding device 300) can achieve the effects of the respective types as described above in <1. Octree Encoding and Decoding Orders>. That is, the encoding device 300 encodes the octree corresponding to point cloud data after initializing the context for each layer of the octree. Thus, the decoder can select a more appropriate processing order, and decode the encoded data of the octree in the more appropriate processing order.

3. Second Embodiment

<Decoding Device>

Figure 28:
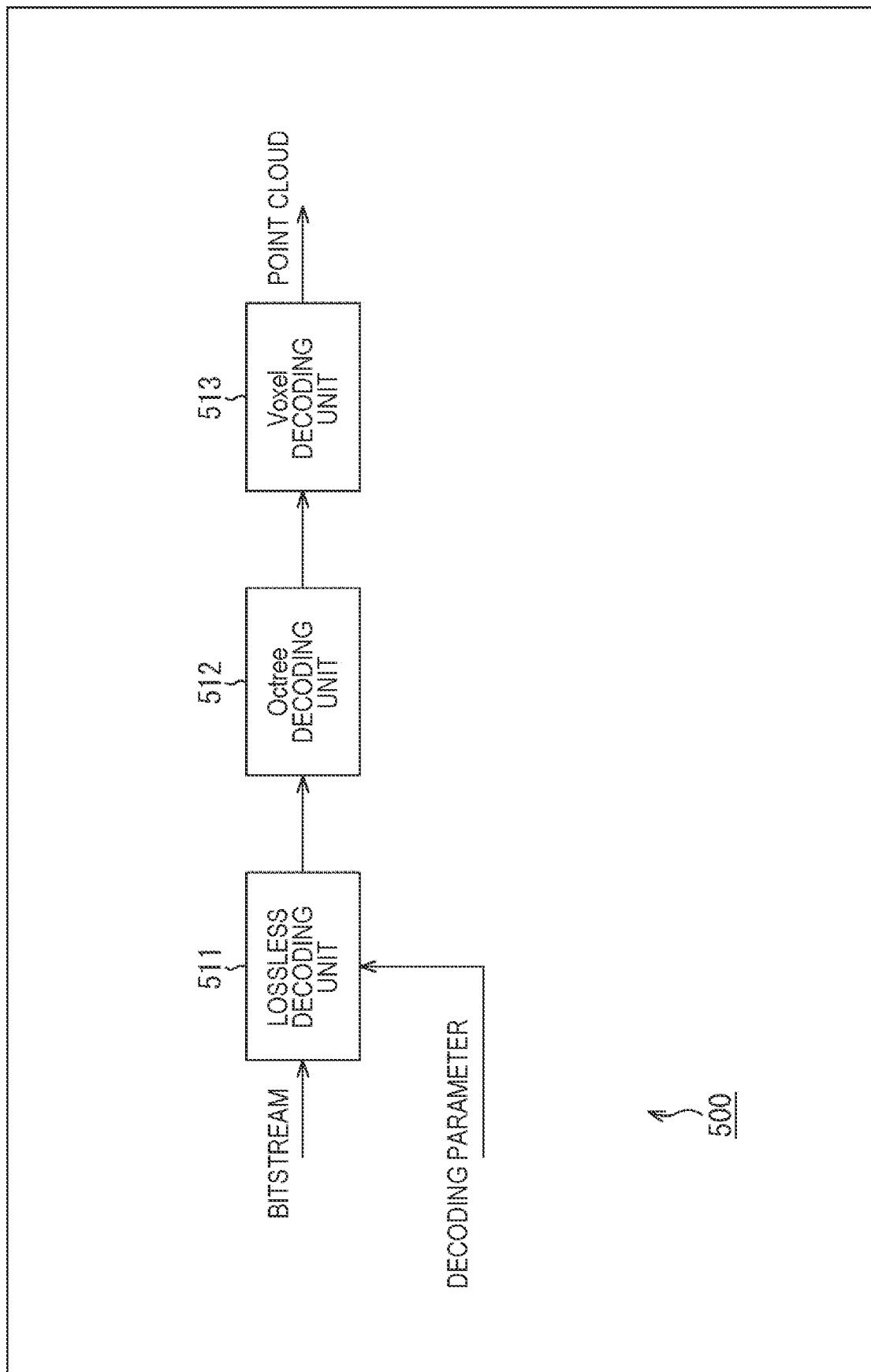
FIG. 28 is a block diagram showing a typical example configuration of a decoding device.

FIG. 28 is a block diagram showing an example configuration of a decoding device as an embodiment of an image processing apparatus to which the present technology is applied. A decoding device 500 shown in FIG. 28 is a decoding device compatible with the encoding device 300 shown in FIG. 20. For example, the decoding device 500 is a device that decodes encoded data (a bitstream) of a point cloud generated by the encoding device 300, and restores the data of the point cloud.

Note that FIG. 28 shows the principal ones of the processing units, the data flows, and the like, and does not necessarily show all of them. That is, in the decoding device 500, there may be a processing unit that is not shown as a block in FIG. 20, or there may be a processing or data flow that is not indicated by arrows or the like in FIG. 20. This also applies to the other drawings for explaining the processing units and the like in the decoding device 500.

As shown in FIG. 28, the decoding device 500 includes a lossless decoding unit 511, an octree decoding unit 512, and a voxel decoding unit 513.

The lossless decoding unit 511 performs a process related to lossless decoding of encoded data of octree data. For example, the lossless decoding unit 511 acquires a bitstream of (octree data corresponding to) point cloud data that is input to the decoding device 500. Further, the lossless decoding unit 511 also acquires a decoding parameter that is input from the outside of the decoding device 500. This decoding parameter is information that specifies a decoding order, and is input by a user operation or is supplied from an external device or the like, for example. The lossless decoding unit 511 decodes the bitstream by the type specified by this decoding parameter, to generate octree data. The lossless decoding unit 511 supplies the octree data to the octree decoding unit 512.

The octree decoding unit 512 performs a process related to decoding of an octree. For example, the octree decoding unit 512 acquires the octree data supplied from the lossless decoding unit 511. Further, the octree decoding unit 512 also constructs an octree from the octree data, and generates voxel data from the octree. The octree decoding unit 512 supplies the generated voxel data to the voxel decoding unit 513.

The voxel decoding unit 513 performs a process related to decoding of voxel data. For example, the voxel decoding unit 513 acquires the voxel data supplied from the octree decoding unit 512. Further, the voxel decoding unit 513 also restores the point cloud from the acquired voxel data. The voxel decoding unit 513 outputs the point cloud data generated in this manner to the outside of the decoding device 500.

Note that these processing units (the lossless decoding unit 511, the octree decoding unit 512, and the voxel decoding unit 513) have any appropriate configurations. For example, each processing unit may be formed with a logic circuit that achieves the processes described above. Further, each processing unit may also include a CPU, ROM, RAM, and the like, for example, and execute a program using them, to perform the processes described above. Each processing unit may of course have both configurations, and perform some of the processes described above with a logic circuit, and the other by executing a program. The configurations of the respective processing units may be independent of one another. For example, one processing unit may perform some of the processes described above with a logic circuit while the other processing units perform the processes described above by executing a program. Further, some other processing unit may perform the processes described above both with a logic circuit and by executing a program.

As described above, the lossless decoding unit 511 is compatible with a plurality of decoding orders (a breadth-first order and a depth-first order), selects a breadth-first order or a depth-first order as the order of decoding of the encoded data of the octree corresponding to point cloud data, and decodes the encoded data in the selected decoding order. Accordingly, the decoding device 500 can decode the encoded data of the octree in a wider variety of processing orders. Thus, the decoding device 500 can select a more appropriate processing order, and decode the encoded data of the octree in the more appropriate processing order.

<Lossless Decoding Unit>

Figure 29:
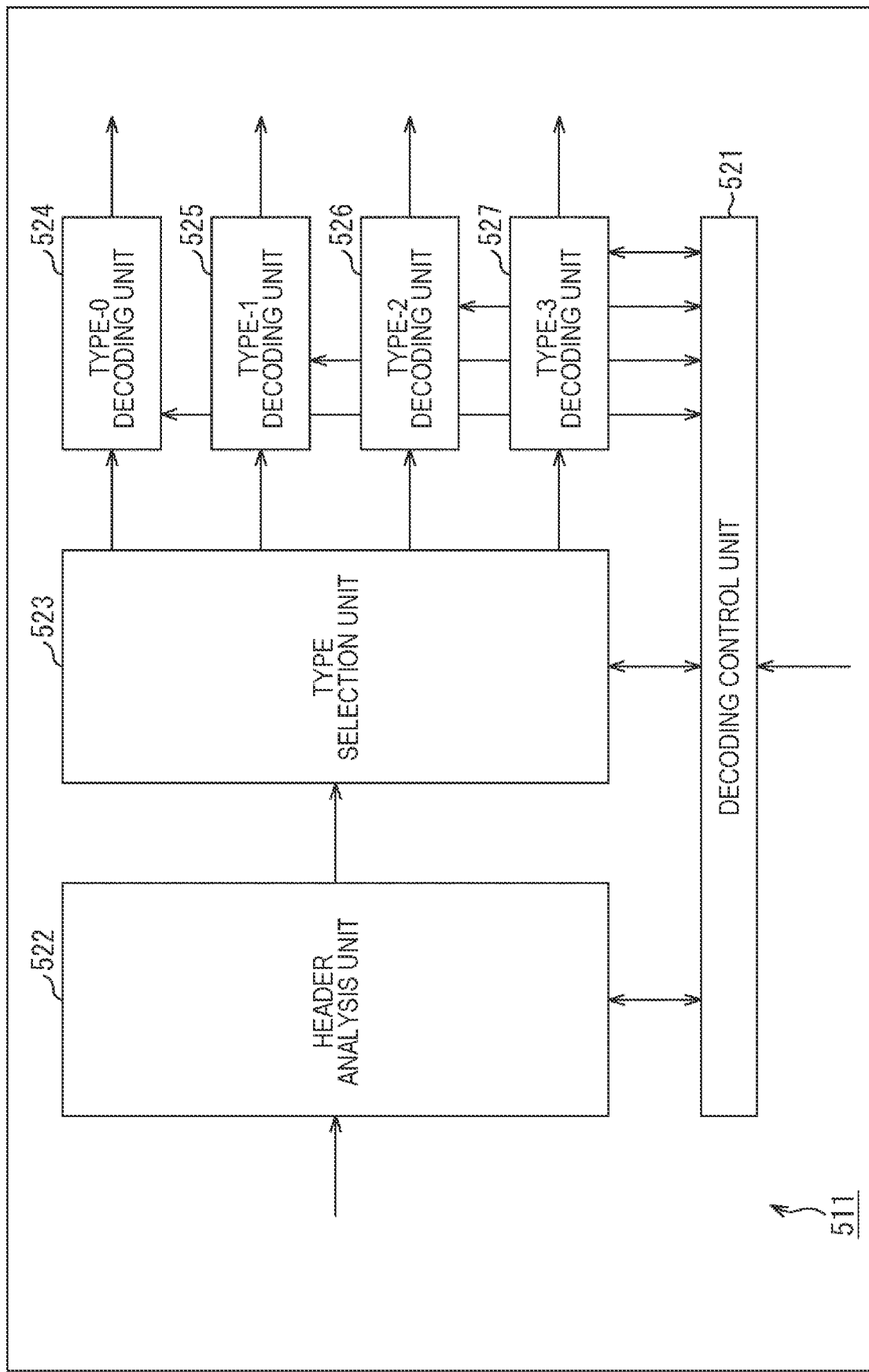
FIG. 29 is a block diagram showing a typical example configuration of a lossless decoding unit.

FIG. 29 is a block diagram showing a typical example configuration of the lossless decoding unit 511. In the case of this example, the lossless decoding unit 511 can decode encoded data of an octree by the type corresponding to the type for performing encoding after initializing the context for each layer of the octree. That is, the lossless decoding unit 511 can correctly decode the encoded data of an octree encoded after initialization of the context for each layer. Further, the lossless decoding unit 511 can also decode the encoded data of the octree in either a breadth-first order or a depth-first order.

As shown in FIG. 29, the lossless decoding unit 511 includes a decoding control unit 521, a header analysis unit 522, a type selection unit 523, a type-0 decoding unit 524, a type-1 decoding unit 525, a type-2 decoding unit 526, and a type-3 decoding unit 527.

The decoding control unit 521 performs a process related to decoding control. For example, the decoding control unit 521 acquires a decoding parameter supplied from the outside of the decoding device 500. Further, the decoding control unit 521 also acquires header information (various kinds of information signaled as a frame header, an LoD header, and the like) analyzed by the header analysis unit 522. Further, the decoding control unit 521 further controls the respective processing units of the type selection unit 523 to the type-3 decoding unit 527 on the basis of the header information, and decodes the encoded data of each node of the octree in the decoding order designated by the decoding parameter (a breadth-first order or a depth-first order).

The header analysis unit 522 performs a process related to header analysis. For example, the header analysis unit 522 acquires a bitstream that is input to the decoding device 500, and supplies the bitstream to the type selection unit 523. Further, the header analysis unit 522 also analyzes the header contained in the acquired bitstream, and supplies the header information (particularly, information regarding the type as described above with reference to FIG. 19) to the decoding control unit 521.

The type selection unit 523 performs a process related to selection of a type of encoding. For example, the type selection unit 523 acquires the bitstream supplied from the header analysis unit 522. Further, under the control of the decoding control unit 521, the type selection unit 523 also supplies the bitstream to the processing unit compatible with the applied type of encoding among processing units of the type-0 decoding unit 524 to the type-3 decoding unit 527 (switches the bitstream supply destination). For example, the type selection unit 523 can select a type of encoding (a type of decoding) to be applied for each node (or switch the bitstream supply destination for each node).

The type-0 decoding unit 524 performs a process related to type-0 decoding corresponding to the "type-0 encoding" described above with reference to FIGS. 4, 5, and others in <Breadth-First Order> in <1. Octree Encoding and Decoding Orders>, for example. For example, the type-0 decoding unit 524 acquires the bitstream supplied from the type selection unit 523. Further, the type-0 decoding unit 524 also performs type-0 decoding on the bitstream, to generate octree data. That is, the type-0 decoding unit 524 arithmetically decodes the bitstream of the processing target node, using the context that is the result of processing of the node processed immediately before the current processing target node. The type-0 decoding unit 524 supplies the octree data obtained by such decoding, to the octree decoding unit 512. Under the control of the decoding control unit 521, the type-0 decoding unit 524 performs these processes.

The type-1 decoding unit 525 performs a process related to type-1 decoding corresponding to the "type-1 encoding" described above with reference to FIGS. 9, 10, and others in <Type 1> in <1. Octree Encoding and Decoding Orders>, for example. For example, the type-1 decoding unit 525 acquires the bitstream supplied from the type selection unit 523. Further, the type-1 decoding unit 525 also performs type-1 decoding on the bitstream, to generate octree data. That is, the type-1 decoding unit 525 arithmetically decodes the bitstream of the processing target node independently of the nodes of the other hierarchical layers (LoDs). The type-1 decoding unit 525 supplies the octree data obtained by such decoding, to the octree decoding unit 512. Under the control of the decoding control unit 521, the type-1 decoding unit 525 performs these processes.

The type-2 decoding unit 526 performs a process related to type-2 decoding corresponding to the "type-2 encoding" described above with reference to FIGS. 11, 12, and others in <Type 2> in <1. Octree Encoding and Decoding Orders>, for example. For example, the type-2 decoding unit 526 acquires the bitstream supplied from the type selection unit 523. Further, the type-2 decoding unit 526 also performs type-2 decoding on the bitstream, to generate octree data. That is, in a case where the processing target node is the first node of the processing target LoD, the type-2 decoding unit 526 decodes the bitstream of the processing target node by using the probability table of the parent node. In a case where the processing target node is some other node, the type-2 decoding unit 526 performs arithmetic decoding on the processing target node independently of the nodes of the other hierarchical layers (LoDs). The type-2 decoding unit 526 supplies the octree data obtained by such decoding, to the octree decoding unit 512. Under the control of the decoding control unit 521, the type-2 decoding unit 526 performs these processes.

The type-3 decoding unit 527 performs a process related to type-3 decoding corresponding to the "type-3 encoding" described above with reference to FIGS. 13, 14, and others in <Type 3> in <1. Octree Encoding and Decoding Orders>, for example. For example, the type-3 decoding unit 527 acquires the bitstream supplied from the type selection unit 523. Further, the type-3 decoding unit 527 also performs type-3 decoding on the bitstream, to generate octree data. That is, in a case where the processing target node is the first node of the processing target LoD, the type-3 decoding unit 527 decodes the bitstream of the processing target node by using the probability table of a predetermined node of the previous frame. In a case where the processing target node is some other node, the type-3 decoding unit 527 performs arithmetic decoding on the processing target node independently of the nodes of the other hierarchical layers (LoDs). The type-3 decoding unit 527 supplies the octree data obtained by such decoding, to the octree decoding unit 512. Under the control of the decoding control unit 521, the type-3 decoding unit 527 performs these processes.

Note that these processing units (the decoding control unit 521 to the type-3 decoding unit 527) have any appropriate configurations. For example, each processing unit may be formed with a logic circuit that achieves the processes described above. Alternatively, each processing unit may include a central processing unit (CPU), a read only memory (ROM), a random access memory (RAM), and the like, for example, and execute a program using these components, to perform the processes described above. Each processing unit may of course have both configurations, and perform some of the processes described above with a logic circuit, and the other by executing a program. The configurations of the respective processing units may be independent of one another. For example, one processing unit may perform some of the processes described above with a logic circuit while the other processing units perform the processes described above by executing a program. Further, some other processing unit may perform the processes described above both with a logic circuit and by executing a program.

In the decoding device 500 having the above configuration, the lossless decoding unit 511 selects a breadth-first order or a depth-first order as the order of decoding of the encoded data of the octree corresponding to point cloud data, and decodes the encoded data in the selected decoding order. For example, the decoding control unit 521 selects a breadth-first order or a depth-first order as the decoding order, and selects the processing target node in accordance with the decoding order. Accordingly, the decoding device 500 can decode octree encoded data (a bitstream) in a wider variety of processing orders. Thus, the decoding device 500 can select a more appropriate processing order, and decode octree encoded data in the more appropriate processing order.

As described above, in the case of the example illustrated in FIG. 29, the decoding control unit 521 selects a decoding order on the basis of a decoding parameter supplied from the outside. That is, the lossless decoding unit 511 (the decoding control unit 521) may select a decoding order in accordance with an external instruction. In this manner, a decoding order can be designated from the outside of the decoding device 500. That is, the user or the like can designate a decoding order, for example.

Note that embodiments are not limited to this example, and the decoding control unit 521 may designate a decoding order depending on the situation. For example, the decoding control unit 521 may select a decoding order on the basis of the load of the decoding process for encoded data. In this manner, the decoding device 500 can select a decoding order without any external instruction from the user or the like.

At that point of time, the parameter related to the load of the decoding process to be used as the reference for selecting a decoding order is any appropriate parameter. For example, the decoding control unit 521 may select a decoding order on the basis of the speed of the decoding process. Alternatively, the decoding control unit 521 may select a decoding order on the basis of the amount of memory to be used in the decoding process, for example.

Meanwhile, in a case where encoding has not been performed after the context was initialized for each layer of the octree in the encoded data (bitstream) to be decoded, a depth-first order cannot be selected as the decoding order due to the data dependency of each node. Therefore, in such a case, the decoding control unit 521 may select a breadth-first order as the decoding order.

More specifically, in a case where encoding has not been performed by a method of encoding the respective layers of an octree independently of one another, a method of encoding the first node of each layer of an octree using the probability table of the first node of the layer one level higher, a method of encoding the first node of each layer of an octree using the probability table of a predetermined node of the previous frame, or a method that is a combination of those methods, the decoding control unit 521 may select a breadth-first order as the decoding order.

In this manner, it is possible to prevent the occurrence of a process failure. Accordingly, it is possible to prevent an increase in load due to unnecessary processing. In other words, a decoding process can be performed at a higher speed.

Note that such determination as to whether or not encoding has been performed after initialization of the context for each layer of an octree may be made on the basis of information indicating the octree encoding method in the encoded data. For example, on the basis of the type contained in the frame header or the LoD header described above with reference of FIG. 19, the decoding control unit 521 may determine whether or not the encoding has been performed after initialization of the context for each layer of the octree. In this manner, the decoding device 500 can more easily determine whether or not the encoding has been performed after initialization of the context for each layer of the octree.

Note that the decoding control unit 521 controls the type selection unit 523 on the basis of the header information (regarding the number of slices, offset, size, and the like, for example) analyzed by the header analysis unit 522, and causes the type selection unit 523 to extract the portion corresponding to the processing target node from a bitstream. Further, the decoding control unit 521 further specifies the type of encoding of the processing target node, on the basis of the header information (regarding type and the like, for example). The decoding control unit 521 controls the type selection unit 523, and causes the type selection unit 523 to supply the extracted bitstream of the processing target node to the decoding unit compatible with the specified type of encoding among the decoding units of the type-0 decoding unit 524 to the type-3 decoding unit 527. Further, the decoding control unit 521 also controls the decoding unit (one of the decoding units of the type-0 decoding unit 524 to the type-3 decoding unit 527) to which the bitstream has been supplied, and causes the decoding unit to decode the bitstream.

That is, the decoding device 500 can decode the bitstream of each node by an appropriate type for its encoding type. Thus, the decoding device 500 can more accurately decode the bitstream of octree data.

Note that, in a case where the type of encoding is the type 4, the data of each node is also encoded by one of the types 0 to 3. Also, in decoding, the type of decoding can be controlled at least on a node-by-node basis as described above. Accordingly, in a case where the type of encoding is the type 4, the decoding device 500 can perform processing in a manner similar to that in a case where the type of encoding is one of the types 0 to 3.

Note that, in the above description, the lossless decoding unit 511 includes the decoding units of the type-0 decoding unit 524 to the type-3 decoding unit 527. That is, the decoding device 500 described above can perform the four types of decoding of the types 0 to 3 (the type 4 is not included herein). However, the decoding device 500 may be capable of performing decoding of any appropriate type. For example, the decoding device 500 may be capable of performing decoding of a type other than the examples described above.

Further, the number of types with which the decoding device 500 is compatible is any appropriate number, and is not limited to the above example. In other words, the decoding device 500 may be capable of performing three or less types of decoding, or may be capable of performing five or more types of decoding, for example.

In either case, the lossless decoding unit 511 is only required to include, in parallel, decoding units of types the decoding device 500 can perform, like the decoding units of the type-0 decoding unit 524 to the type-3 decoding unit 527. That is, in the example illustrated in FIG. 29, the lossless decoding unit 511 includes the four decoding units of the type-0 decoding unit 524 to the type-3 decoding unit 527. However, the lossless decoding unit 511 is not limited to this example, and may include three or less decoding units, or five or more decoding units.

<Flow in a Decoding Process>

Figure 30:
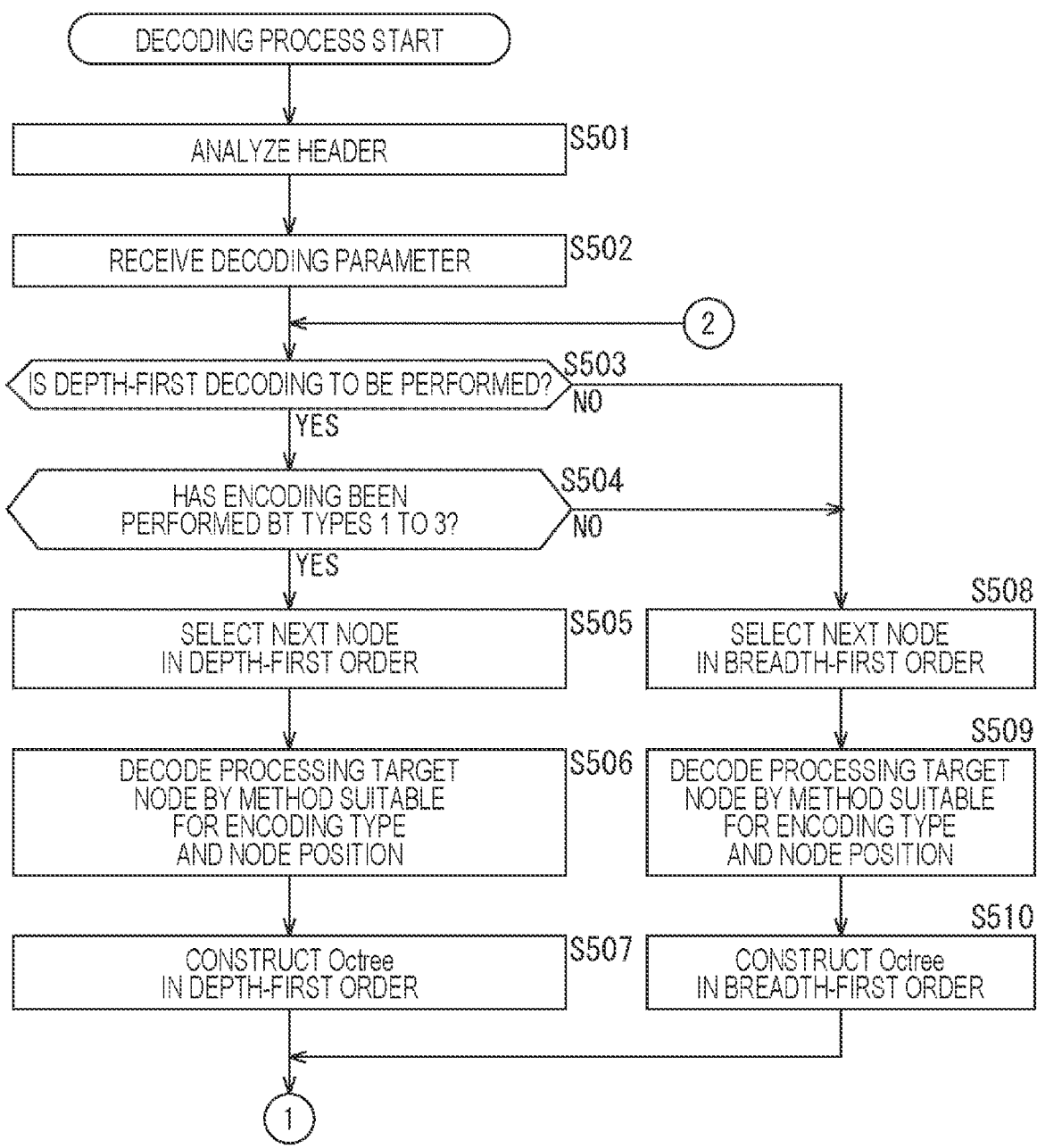
FIG. 30 is a flowchart for explaining an example flow in a decoding process.
Figure 31:
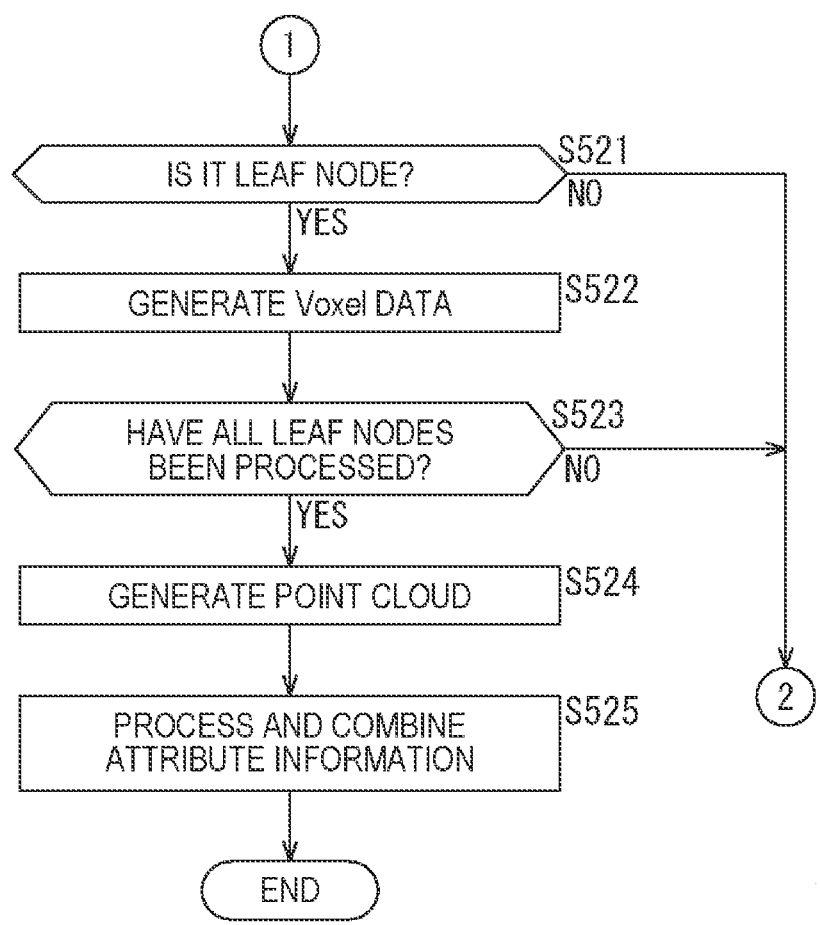
FIG. 31 is a flowchart continuing from FIG. 30, for explaining an example flow in a decoding process.

Next, an example flow in a decoding process to be performed by the decoding device 500 is described, with reference to a flowchart shown in FIGS. 30 and 31.

When the decoding process is started, the header analysis unit 522 of the lossless decoding unit 511 of the decoding device 500 in step S501 analyzes the header (such as a frame header or an LoD header, for example) included in a bitstream input to the decoding device 500.

In step S502, the decoding control unit 521 of the lossless decoding unit 511 receives a decoding parameter.

In step S503, the decoding control unit 521 determines whether or not to perform decoding in a depth-first order, on the basis of the decoding parameter acquired in step S502. If it is determined that a depth-first order is to be the decoding order, the process moves on to step S504.

In step S504, the decoding control unit 521 determines whether or not the bitstream has been encoded by one of the types 1 to 3, on the basis of the header analyzed in step S501. If it is determined that the encoding has been performed by one of the types 1 to 3, the process moves on to step S505.

In step S505, the decoding control unit 521 selects the next node in the depth-first order.

In step S506, the decoding control unit 521 controls the processing units of the type selection unit 523 to the type-3 decoding unit 527, and decodes the processing target node by the method suitable for the type of encoding and the node position.

In step S507, the octree decoding unit 512 constructs, in the depth-first order, an octree from the octree data generated by the process in step S506. When the process in step S507 is completed, the process moves on to step S521 in FIG. 31.

Further, if it is determined in step S503 in FIG. 30 that decoding is to be performed in a breadth-first order, on the other hand, the process moves on to step S508. Further, if it is determined in step S504 that the bitstream has not been encoded by any of the types 1 to 3 (or has been encoded by the type 0, for example), on the other hand, the process moves on to step S508.

In step S508, the decoding control unit 521 selects the next node in the breadth-first order.

In step S509, the decoding control unit 521 controls the processing units of the type selection unit 523 to the type-3 decoding unit 527, and decodes the processing target node by the method suitable for the type of encoding and the node position.

In step S510, the octree decoding unit 512 constructs, in the breadth-first order, an octree from the octree data generated by the process in step S508. When the process in step S507 is completed, the process moves on to step S521 in FIG. 31.

In step S521 in FIG. 31, the decoding control unit 521 determines whether or not the processing target node is a leaf node (a terminal node to which any other nodes (or child nodes) do not belong). If it is determined that the processing target node has a child node and is not a leaf node, the process returns to step S503 in FIG. 30, and the processes in step S503 and the steps that follow are repeated.

Further, if it is determined in step S521 in FIG. 31 that the processing target node has no child nodes and is a leaf node, on the other hand, the process moves on to step S522.

In step S522, the octree decoding unit 512 generates voxel data corresponding to the leaf node.

In step S523, the decoding control unit 521 determines whether or not all the leaf nodes have been processed. If it is determined that there is an unprocessed leaf node, the process returns to step S503 in FIG. 30, and the processes in step S503 and the steps that follow are repeated.

Further, if it is determined in step S523 in FIG. 31 that all the leaf nodes have been processed, on the other hand, the process moves on to step S524.

In step S524, the voxel decoding unit 513 generates point cloud data from the voxel data generated in step S522.

In step S525, the decoding units of the lossless decoding unit 511 to the voxel decoding unit 513 process the attribute information, and combine the attribute information with the positional information described above. When the point cloud data is restored in the above manner, the voxel decoding unit 513 outputs the generated point cloud data to the outside of the decoding device 500.

When the process in step S525 is completed, the decoding process comes to an end.

By performing the respective processes as described above, the decoding device 500 can decode octree encoded data (a bitstream) in a wider variety of processing orders. Thus, the decoding device 500 can select a more appropriate processing order, and decode octree encoded data in the more appropriate processing order.

4. Notes

<Computer>

The above described series of processes can be performed by hardware or can be performed by software. In a case where the series of processes are to be performed by software, the program that forms the software is installed into a computer. Here, the computer may be a computer incorporated into special-purpose hardware, or may be a general-purpose personal computer or the like that can execute various kinds of functions when various kinds of programs are installed thereinto, for example.

Figure 32:
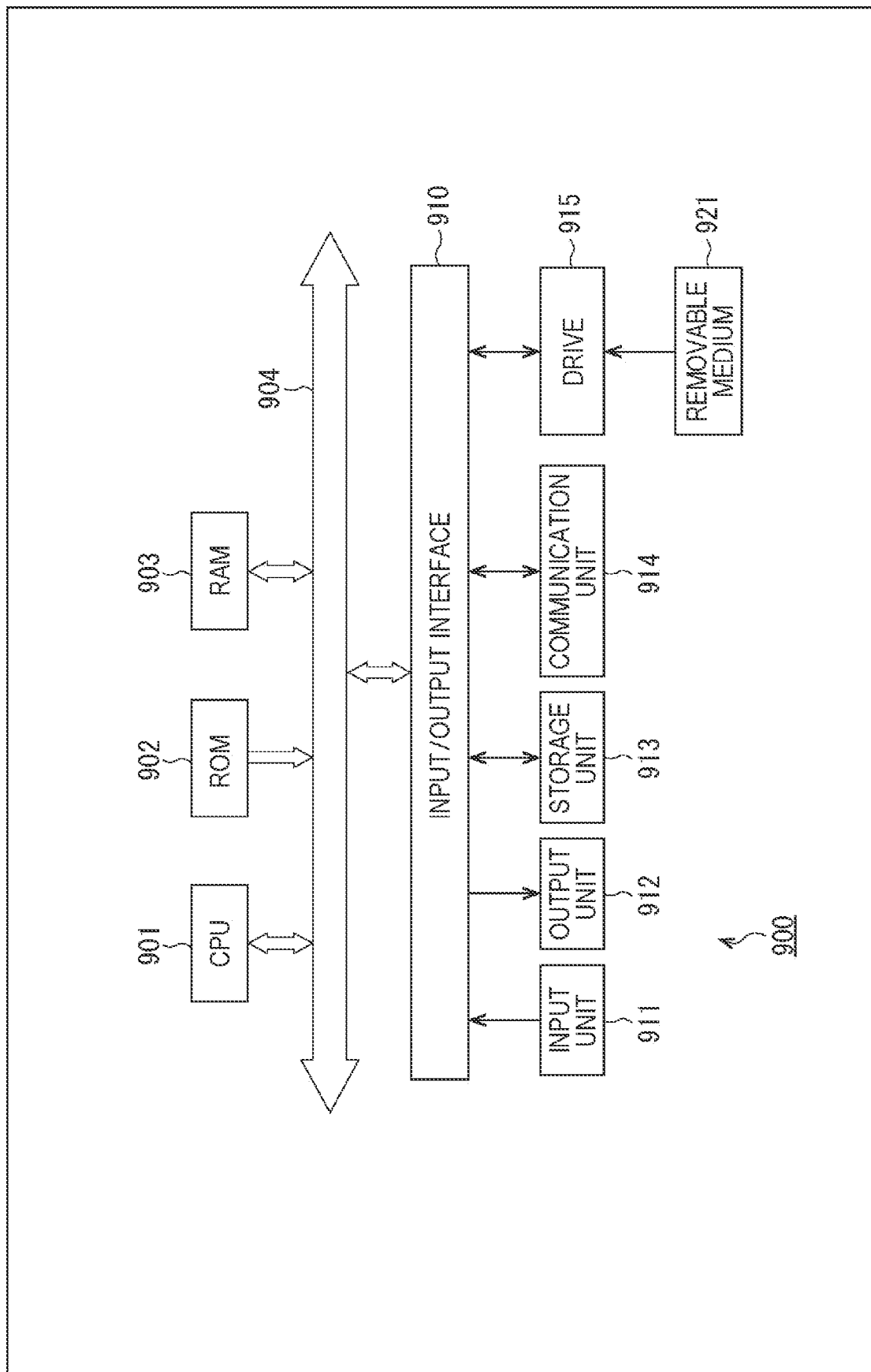
FIG. 32 is a block diagram showing a typical example configuration of a computer.

FIG. 32 is a block diagram showing an example configuration of the hardware of a computer that performs the above described series of processes in accordance with a program.

In a computer 900 shown in FIG. 32, a central processing unit (CPU) 901, a read only memory (ROM) 902, and a random access memory (RAM) 903 are connected to one another by a bus 904.

An input/output interface 910 is also connected to the bus 904. An input unit 911, an output unit 912, a storage unit 913, a communication unit 914, and a drive 915 are connected to the input/output interface 910.

The input unit 911 is formed with a keyboard, a mouse, a microphone, a touch panel, an input terminal, and the like, for example. The output unit 912 is formed with a display, a speaker, an output terminal, and the like, for example. The storage unit 913 is formed with a hard disk, a RAM disk, a nonvolatile memory, and the like, for example. The communication unit 914 is formed with a network interface, for example. The drive 915 drives a removable medium 921 such as a magnetic disk, an optical disk, a magnetooptical disk, or a semiconductor memory.

In the computer having the above described configuration, the CPU 901 loads a program stored in the storage unit 913 into the RAM 903 via the input/output interface 910 and the bus 904, for example, and executes the program, so that the above described series of processes is performed. The RAM 903 also stores data necessary for the CPU 901 to perform various processes and the like as necessary.

The program to be executed by the computer (the CPU 901) may be recorded on the removable medium 921 as a packaged medium or the like to be used, for example. In that case, the program can be installed into the storage unit 913 via the input/output interface 910 when the removable medium 921 is mounted on the drive 915.

Alternatively, this program can be provided via a wired or wireless transmission medium such as a local area network, the Internet, or digital satellite broadcasting. In that case, the program may be received by the communication unit 914, and be installed into the storage unit 913.

Also, this program may be installed beforehand into the ROM 902 or the storage unit 913.

<Targets to which the Present Technology is Applied>

Although cases where the present technology is applied to encoding and decoding of point cloud data have been described so far, the present technology is not limited to those examples, but can be applied to encoding and decoding of 3D data of any standard. That is, various processes such as encoding and decoding processes, and any specifications of various kinds of data such as 3D data and metadata can be adopted, as long as the present technology described above is not contradicted. Also, some of the processes and specifications described above may be omitted, as long as the present technology is not contradicted.

The present technology can be applied to any appropriate configuration. For example, the present technology can be applied to various electronic apparatuses, such as transmitters and receivers (television receivers or portable telephone devices, for example) in satellite broadcasting, cable broadcasting such as cable TV, distribution via the Internet, distribution to terminals via cellular communication, or the like, and apparatuses (hard disk recorders or cameras, for example) that record images on media such as optical disks, magnetic disks, and flash memory, and reproduce images from these storage media, for example.

Further, the present technology can also be embodied as a component of an apparatus, such as a processor (a video processor, for example) serving as a system LSI (Large Scale Integration) or the like, a module (a video module, for example) using a plurality of processors or the like, a unit (a video unit, for example) using a plurality of modules or the like, or a set (a video set, for example) having other functions added to units.

Further, the present technology can also be applied to a network system formed with a plurality of devices, for example. For example, the present technology may be embodied as cloud computing that is shared and jointly processed by a plurality of devices via a network. For example, the present technology may be embodied in a cloud service that provides services related to images (video images) to any kinds of terminals such as computers, audio visual (AV) devices, portable information processing terminals, and IoT (Internet of Things) devices.

Note that, in the present specification, a system means an assembly of plurality of components (devices, modules (parts), and the like), and not all the components need to be provided in the same housing. In view of this, plurality of devices that are housed in different housings and are connected to one another via a network form a system, and one device having plurality of modules housed in one housing is also a system.

<Fields and Usage to which the Present Technology can be Applied>

A system, an apparatus, a processing unit, and the like to which the present technology is applied can be used in any appropriate field such as transportation, medical care, crime prevention, agriculture, the livestock industry, mining, beauty care, factories, household appliances, meteorology, or nature observation, for example. Further, the present technology can also be used for any appropriate purpose.

<Other Aspects>

Note that, in this specification, a "flag" is information for identifying a plurality of states, and includes not only information to be used for identifying two states of true (1) or false (0), but also information for identifying three or more states. Therefore, the values this "flag" can have may be the two values of "1" and "0", for example, or three or more values. That is, this "flag" may be formed with any number of bits, and may be formed with one bit or a plurality of bits. Further, as for identification information (including a flag), not only the identification information but also difference information about the identification information with respect to reference information may be included in a bitstream. Therefore, in this specification, a "flag" and "identification information" include not only the information but also difference information with respect to the reference information.

Further, various kinds of information (such as metadata) regarding encoded data (a bitstream) may be transmitted or recorded in any mode that is associated with the encoded data. Here, the term "to associate" means to enable use of other data (or a link to other data) while data is processed, for example. That is, pieces of data associated with each other may be integrated as one piece of data, or may be regarded as separate pieces of data. For example, information associated with encoded data (an image) may be transmitted through a transmission path different from the encoded data (image). Further, information associated with encoded data (an image) may be recorded in a recording medium different from the encoded data (image) (or in a different recording area of the same recording medium), for example. Note that this "association" may apply to some of the data, instead of the entire data. For example, an image and the information corresponding to the image may be associated with each other for any appropriate unit, such as for a plurality of frames, each frame, or some portion in each frame.

Note that, in this specification, the terms "to combine", "to multiplex", "to add", "to integrate", "to include", "to store", "to contain", "to incorporate, "to insert", and the like mean combining a plurality of objects into one, such as combining encoded data and metadata into one piece of data, for example, and mean a method of the above described "association".

Further, embodiments of the present technology are not limited to the above described embodiments, and various modifications may be made to them without departing from the scope of the present technology.

For example, any configuration described above as one device (or one processing unit) may be divided into a plurality of devices (or processing units). Conversely, any configuration described above as a plurality of devices (or processing units) may be combined into one device (or one processing unit). Furthermore, it is of course possible to add a component other than those described above to the configuration of each device (or each processing unit). Further, some components of a device (or processing unit) may be incorporated into the configuration of another device (or processing unit) as long as the configuration and the functions of the entire system remain substantially the same.

Also, the program described above may be executed in any device, for example. In that case, the device is only required to have necessary functions (function blocks and the like) so that necessary information can be obtained.

Also, one device may carry out each step in one flowchart, or a plurality of devices may carry out each step, for example. Further, in a case where one step includes a plurality of processes, the plurality of processes may be performed by one device or may be performed by a plurality of devices. In other words, a plurality of processes included in one step may be performed as processes in a plurality of steps. Conversely, processes described as a plurality of steps may be collectively performed as one step.

Also, a program to be executed by a computer may be a program for performing the processes in the steps according to the program in chronological order in accordance with the sequence described in this specification, or may be a program for performing processes in parallel or performing a process when necessary, such as when there is a call, for example. That is, as long as there are no contradictions, the processes in the respective steps may be performed in a different order from the above described order. Further, the processes in the steps according to this program may be executed in parallel with the processes according to another program, or may be executed in combination with the processes according to another program.

Also, each of the plurality of techniques according to the present technology can be independently implemented, as long as there are no contradictions, for example. It is of course also possible to implement a combination of some of the plurality of techniques according to the present technology. For example, part or all of the present technology described in one of the embodiments may be implemented in combination with part or all of the present technology described in another one of the embodiments. Further, part or all of the present technology described above may be implemented in combination with some other technology not described above.

Note that the present technology may also be embodied in the configurations described below.

(1) An image processing apparatus including
an encoding unit that encodes an octree corresponding to point cloud data after initializing the context for each layer of the octree.

(2) The image processing apparatus according to (1), in which
the encoding unit encodes the respective layers of the octree independently of one another.

(3) The image processing apparatus according to (1) or (2), in which
the encoding unit encodes the first node of each layer of the octree, using the probability table of the first node of the layer one level higher.

(4) The image processing apparatus according to any one of (1) to (3), in which
the encoding unit encodes the first node of each layer of the octree, using the probability table of a predetermined node of the previous frame.

(5) The image processing apparatus according to (4), in which
the predetermined node is the last node of the same layer as the processing target node.

(6) The image processing apparatus according to (4), in which
the predetermined node is the last node of the previous frame.

(7) The image processing apparatus according to any one of (1) to (6), in which the encoding unit encodes the octree, using at least two of the following methods:
a method of encoding the processing target layer independently of other layers;
a method of encoding the first node of the processing target layer, using the probability table of the first node of the layer one level higher; and
a method of encoding the first node of the processing target layer, using the probability table of a predetermined node of the previous frame.

(8) The image processing apparatus according to any one of (1) to (7), in which the encoding unit
performs encoding on some of the layers of the octree after initializing the context for each layer, and
encodes each node of the other layers of the octree, with the context being the result of processing of the node processed immediately before the current processing target.

(9) The image processing apparatus according to any one of (1) to (8), in which
the encoding unit selects at least one of a plurality of candidates including at least one of the following methods:
a method of encoding the respective layers of the octree independently of one another;
a method of encoding the first node of each layer of the octree, using the probability table of the first node of the layer one level higher; and
a method of encoding the first node of each layer of the octree, using the probability table of a predetermined node of the previous frame, and
encodes the octree, using the selected method.

(10) The image processing apparatus according to (9), in which
the encoding unit generates a bitstream containing information indicating the selected method and encoded data of the octree.

(11) An image processing method including
encoding an octree corresponding to point cloud data after initializing the context for each layer of the octree.

(12) An image processing apparatus including
a decoding unit that selects a breadth-first order or a depth-first order as the decoding order for encoded data of an octree corresponding to point cloud data, and decodes the encoded data in the selected decoding order.

(13) The image processing apparatus according to (12), in which
the decoding unit selects the decoding order in accordance with an external instruction.

(14) The image processing apparatus according to (12) or (13), in which
the decoding unit selects the decoding order on the basis of the load of a decoding process for the encoded data.

(15) The image processing apparatus according to (14), in which
the decoding unit selects the decoding order on the basis of the speed of the decoding process.

(16) The image processing apparatus according to (14) or (15), in which
the decoding unit selects the decoding order on the basis of the amount of memory to be used by the decoding process.

(17) The image processing apparatus according to any one of (12) to (16), in which,
when the octree in the encoded data has not been encoded after the context was initialized for each layer of the octree, the decoding unit selects the breadth-first order as the decoding order.

(18) The image processing apparatus according to (17), in which,
when the octree in the encoded data has not been encoded by one or a combination of at least two of:
a method of encoding the respective layers of the octree independently of one another;
a method of encoding the first node of each layer of the octree, using the probability table of the first node of the layer one level higher; and
a method of encoding the first node of each layer of the octree, using the probability table of a predetermined node of the previous frame,
the decoding unit selects the breadth-first order as the decoding order.

(19) The image processing apparatus according to (17) or (18), in which
the decoding unit determines whether encoding has been performed after initialization of the context for each layer of the octree, on the basis of information indicating the method of encoding of the octree in the encoded data.

(20) An image processing method including
selecting a breadth-first order or a depth-first order as the decoding order for encoded data of an octree corresponding to point cloud data, and decoding the encoded data in the selected decoding order.

REFERENCE SIGNS LIST

300 Encoding device
311 Voxel generation unit

312 Octree generation unit
321 Encoding control unit
322 Type selection unit
323 Type-0 encoding unit
324 Type-1 encoding unit
325 Type-2 encoding unit
326 Type-3 encoding unit
327 Bitstream generation unit
500 Decoding device
511 Lossless decoding unit
512 Octree decoding unit
513 Voxel decoding unit
521 Decoding control unit
522 Header analysis unit
523 Type selection unit
524 Type-0 decoding unit
525 Type-1 decoding unit
526 Type-2 decoding unit
527 Type-3 decoding unit

The invention claimed is:

1. An image processing apparatus, comprising:
circuitry configured to:
    acquire encoded data of an octree corresponding to point cloud data;
    acquire a first decoding-type parameter indicating that an encoding dependency relationship between a first slice of the octree and a second slice of the octree has been eliminated in at least one layer of the octree;
    select, in accordance with the first decoding-type parameter, a depth-oriented order as a decoding order for the encoded data; and
    decode the encoded data in the depth-oriented order.

2. The image processing apparatus according to claim 1, wherein
    the circuitry is further configured to determine a breadth-oriented order as the decoding order when failing to acquire the first decoding-type parameter, and
    the breadth-oriented order corresponds a relationship where the first slice has an encoding dependency on the second slice in the at least one layer of the octree.

3. The image processing apparatus according to claim 2, wherein
    the circuitry is configured to select the breadth-oriented order as the decoding order when acquiring none of the first decoding-type parameter,
    a second decoding-type parameter indicating a beginning node of the at least one layer of the octree is encoded based on a probability table of the beginning node of an upper layer having a level higher than the at least one layer of the octree, and
    a third decoding-type parameter indicating the beginning node is encoded based on a probability table of a node of a previous frame.

4. The image processing apparatus according to claim 1, wherein the first decoding-type parameter indicates that respective layers of the octree have been encoded independently of one another.

5. An image processing method, comprising:
    acquiring encoded data of an octree corresponding to point cloud data;
    acquiring a first decoding-type parameter indicating that an encoding dependency relationship between a first slice of the octree and a second slice of the octree has been eliminated in at least one layer of the octree;
    selecting, in accordance with the first decoding-type parameter, a depth-oriented order as a decoding order for the encoded data; and
    decoding the encoded data in the depth-oriented order.

* * * * *